United States Patent
Imai et al.

(10) Patent No.: US 9,177,799 B2
(45) Date of Patent: Nov. 3, 2015

(54) SEMICONDUCTOR DEVICE MANUFACTURING METHOD AND SUBSTRATE MANUFACTURING METHOD OF FORMING SILICON CARBIDE FILMS ON THE SUBSTRATE

(71) Applicant: HITACHI KOKUSAI ELECTRIC, INC., Tokyo (JP)

(72) Inventors: Yoshinori Imai, Nanto (JP); Hideji Shibata, Hamura (JP); Takafumi Sasaki, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 366 days.

(21) Appl. No.: 13/732,460

(22) Filed: Jan. 2, 2013

(65) Prior Publication Data

US 2013/0122692 A1    May 16, 2013

Related U.S. Application Data

(62) Division of application No. 12/782,090, filed on May 18, 2010.

(30) Foreign Application Priority Data

May 19, 2009  (JP) .................................. 2009-120882
Apr. 2, 2010   (JP) .................................. 2010-086380

(51) Int. Cl.
*C30B 25/14* (2006.01)
*H01L 21/205* (2006.01)
(Continued)

(52) U.S. Cl.
CPC ............ *H01L 21/205* (2013.01); *C23C 16/325* (2013.01); *C23C 16/4401* (2013.01);
(Continued)

(58) Field of Classification Search
CPC ...... C30B 25/00; C30B 25/02; C30B 25/025; C30B 25/08; C30B 25/10; C30B 25/12; C30B 25/14; C30B 25/16; C30B 25/165; C23C 14/00; C23C 14/02; C23C 14/021; C23C 16/00; C23C 16/02; C23C 16/0227; C23C 16/0236
USPC ........... 117/84, 88, 91, 93, 99, 102, 105, 937, 117/951
See application file for complete search history.

(56) References Cited

U.S. PATENT DOCUMENTS 4,940,642 A   7/1990  Shirai et al.
5,534,392 A   7/1996  Shirai et al.
(Continued)

FOREIGN PATENT DOCUMENTS

JP   62214614   9/1987
JP   07118854   5/1995
(Continued)

*Primary Examiner* — Kenneth A Bratland, Jr.
(74) *Attorney, Agent, or Firm* — Brundidge & Stanger P.C.

(57) ABSTRACT

Provided is a substrate processing apparatus, a semiconductor device manufacturing method, and a substrate manufacturing method. The substrate processing apparatus comprises: a reaction chamber configured to process substrates; a first gas supply system configured to supply at least a silicon-containing gas and a chlorine-containing gas or at least a gas containing silicon and chlorine; a first gas supply unit connected to the first gas supply system; a second gas supply system configured to supply at least a reducing gas; a second gas supply unit connected to the second gas supply system; a third gas supply system configured to supply at least a carbon-containing gas and connected to at least one of the first gas supply unit and the second gas supply unit; and a control unit configured to control the first to third gas supply systems.

10 Claims, 8 Drawing Sheets

(51) Int. Cl.

| | | |
|---|---|---|
| *C23C 16/32* | (2006.01) | |
| *C23C 16/44* | (2006.01) | |
| *C23C 16/455* | (2006.01) | |
| *C30B 25/16* | (2006.01) | |
| *C30B 29/36* | (2006.01) | |
| *H01L 21/02* | (2006.01) | |

(52) U.S. Cl.
CPC ........... *C23C16/45574* (2013.01); *C30B 25/14* (2013.01); *C30B 25/165* (2013.01); *C30B 29/36* (2013.01); *H01L 21/0262* (2013.01); *H01L 21/02529* (2013.01)

(56) References Cited

U.S. PATENT DOCUMENTS

| | | | |
|---|---|---|---|
| 7,629,267 | B2 | 12/2009 | Wan et al. |
| 7,651,730 | B2 | 1/2010 | Hasebe |
| 2006/0021570 | A1 | 2/2006 | Hasebe et al. |
| 2006/0032442 | A1 | 2/2006 | Hasebe |
| 2006/0199357 | A1 | 9/2006 | Wan et al. |
| 2007/0161216 | A1* | 7/2007 | Bauer ............................ 438/503 |
| 2008/0124945 | A1 | 5/2008 | Miya et al. |
| 2008/0132084 | A1 | 6/2008 | Miya et al. |
| 2008/0242064 | A1 | 10/2008 | Inokuchi et al. |
| 2009/0104740 | A1* | 4/2009 | Inokuchi et al. .............. 438/198 |
| 2009/0159440 | A1 | 6/2009 | Toyoda et al. |
| 2009/0170345 | A1 | 7/2009 | Akae et al. |
| 2009/0253265 | A1 | 10/2009 | Inokuchi et al. |
| 2009/0280652 | A1 | 11/2009 | Miya et al. |
| 2009/0305517 | A1* | 12/2009 | Nakashima et al. .......... 438/786 |
| 2010/0105192 | A1 | 4/2010 | Akae et al. |
| 2010/0130024 | A1 | 5/2010 | Takasawa et al. |
| 2010/0151682 | A1 | 6/2010 | Moriya et al. |
| 2010/0218724 | A1 | 9/2010 | Okada |
| 2010/0282166 | A1 | 11/2010 | Fukuda et al. |
| 2010/0297832 | A1 | 11/2010 | Imai et al. |

FOREIGN PATENT DOCUMENTS

| | | |
|---|---|---|
| JP | 2006321696 | 11/2006 |
| WO | WO 2007116768 A1 * | 10/2007 |

* cited by examiner

Fig. 1 --PRIOR ART--
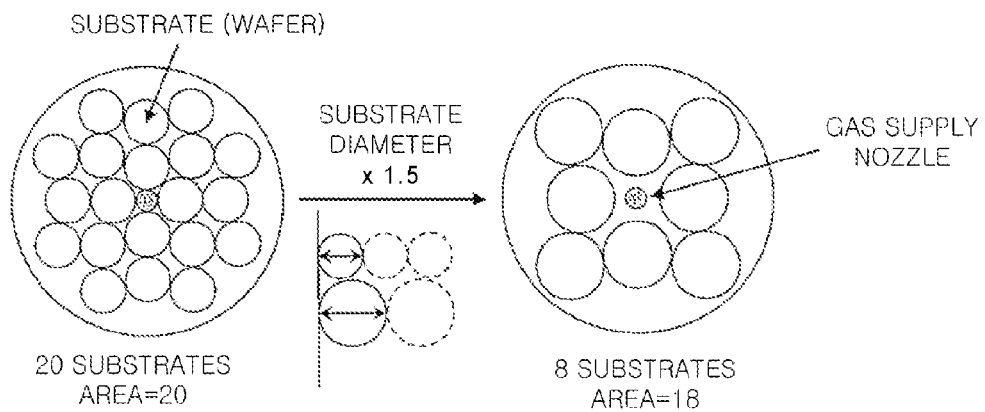
Fig. 2
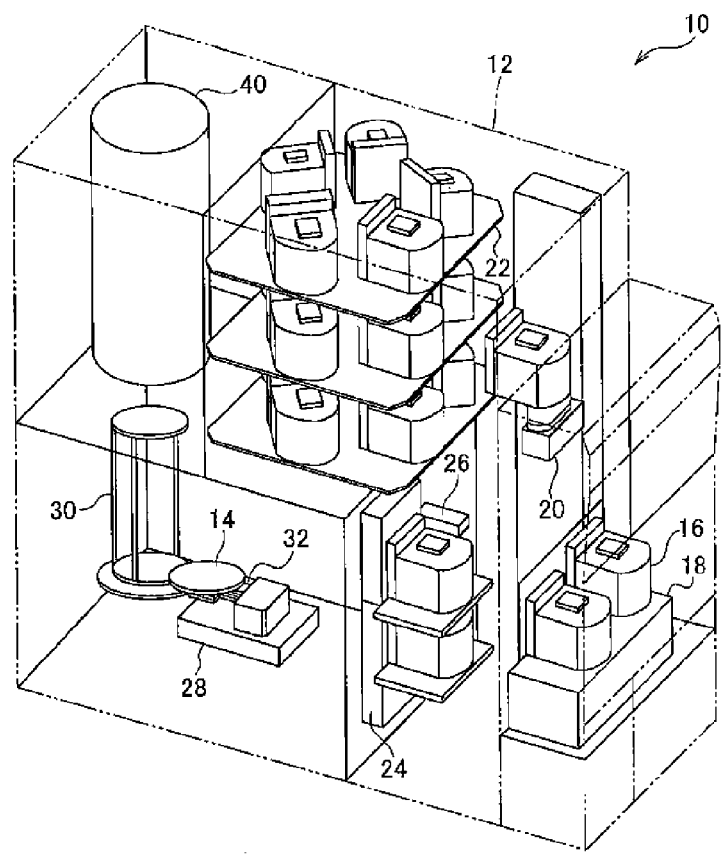

$$SiCl_4 + 2H_2 \Leftrightarrow Si + 4HCl$$

SiH₄-H₂ EQUILIBRIUM CONCENTRATION CALCULATION

Fig. 9 --Prior Art--

MAIN Si-Epi GROWTH SOURCES

|  | SiH4 | SiH2Cl2 | SiHCl3 | SiCl4 |
|---|---|---|---|---|
| BOILING POINT(°C) | -112 | 8.2 | 31.7 | 57.1 |
| MOLECULAR WEIGHT | 32.1 | 101.0 | 135.5 | 169.9 |
| Si-Epi GROWTH TEM(°C) | 950~ | 1050~ | 1100~ | 1150~ |
| DECOMPOSITION | THERMAL | THERMAL | (H)REDUCTION | (H)REDUCTION |

SEMICONDUCTOR DEVICE MANUFACTURING METHOD AND SUBSTRATE MANUFACTURING METHOD OF FORMING SILICON CARBIDE FILMS ON THE SUBSTRATE

CROSS-REFERENCE TO RELATED PATENT APPLICATIONS

This application is a divisional application of application Ser. No. 12/782,090, filed May 18, 2010; which claims priority under 35 U.S.C. §119 of Japanese Patent Application No. 2009-120882, filed on May 19, 2009 and Japanese Patent Application No. 2010-086380, filed on Apr. 2, 2010, in the Japanese Patent Office, the entire contents of which are hereby incorporated by reference.

BACKGROUND OF THE INVENTION

1. Field of the Invention

The present invention relates to a semiconductor device manufacturing method and a substrate manufacturing method.

2. Description of the Related Art

Since silicon carbide (SiC) has advantageous characteristics such as a wide energy band gap, a high dielectric strength voltage, and a high heat conductivity as compared with silicon (Si), silicon carbide attracts attention as an element material, particularly for an element of a power device. However, due to other characteristics of SiC such as a non-liquid state at normal pressure and a low impurity diffusion coefficient, it is difficult, as is known, to fabricate a crystal substrate or a semiconductor device by using SiC as compared with the case of using Si. For example, since a SiC epitaxial film is formed in a high temperature range of about 1500° C. to about 1800° C. as compared with a temperature range of 900° C. to 1200° C. in which a Si epitaxial film is formed, it is necessary to study technology for heat-resistant structures of SiC epitaxial film forming apparatuses and source material decomposition preventing methods. Furthermore, in the case of a substrate processing apparatus configured to form a SiC epitaxial film, since two elements (silicon (Si) and carbon (C)) are used to form a film, additional studies which are not necessary for a silicon film forming apparatus are required for ensuring the uniformities of a film thickness and a composition ratio and controlling a doping level.

As mass-production SiC epitaxial film forming apparatuses, pancake type apparatuses are widely sold in the market. Epitaxial films can be formed by arranging several substrates to about tens of substrates on a susceptor which is heated to a film forming temperature, for example, by high-frequency waves, and supplying a silicon-containing gas (hereinafter also referred to as a Si source gas), a carbon-containing gas (hereinafter also referred to as a C source gas), and a carrier gas to the substrates. Propane ($C_3H_8$) gas or ethylene ($C_2H_4$) gas is widely used as a C source gas, monosilane ($SiH_4$) gas is widely used as a Si source gas, and hydrogen ($H_2$) gas is widely used as a carrier gas. To control formation of silicon nuclei in a gaseous phase and improve crystalline quality, hydrogen chloride (HCl) gas may be added to a source gas, or a material including chlorine (Cl) in its formula such as trichlorosilane ($SiHCl_3$) gas or tetrachlorosilane ($SiCl_4$, silicon tetrachloride) gas may be used as a Si source (for example, refer to Non-patent Document 1).

However, such mass-production substrate processing apparatuses configured to form SiC epitaxial films have the following problems. FIG. 1 is an exemplary schematic view illustrating a relationship between a structure of a pancake type susceptor and positions of substrates. As shown in FIG. 1, the diameter and number of substrates that can be placed on the susceptor are limited to the diameter of the susceptor. Therefore, if the diameter of the substrates is large, the number and total area of the substrates that can be processed at a time are reduced. For example, in the case of FIG. 1, if the diameter of the substrates arranged on the susceptor is increased by a factor of 1.5, the number of the substrates that can be processed at a time is reduced from twenty to eight, and the total area that can be processed at a time is reduced by about 10%. Thus, for mass production with such a pancake type susceptor, it is necessary to increase the number of substrate processing apparatuses or the area of a susceptor of a substrate processing apparatus (that is, the footprint of a substrate processing apparatus); otherwise, production costs are largely increased.

Therefore, the inventors considered that: like in the case of a substrate processing apparatus used for forming a Si film, if one hundred or more substrates having a diameter of, for example, 300 mm are vertically stacked and are batch-processed by employing a vertical structure, an increase of production costs can be prevented without having to increase the number of substrate processing apparatuses or the footprint of a substrate processing apparatus. In such a vertical type substrate processing apparatus, a gas supply nozzle is installed in a reaction chamber to introduce a source gas and uniformly supply the source gas to stacked substrates. In this way, the source gas can be efficiently and uniformly supplied to a plurality of substrates which are vertically stacked, and thus the uniformity of a film thickness can be improved between the substrates and in the surfaces of the substrates.

[Non-patent Document 1] P. VAN DER PUTTE, L. J. GILING and J. BLOEM, "GROWTH AND ETCHING OF SILICON IN CHEMICAL VAPOUR DEPOSITION SYSTEMS; THE INFLUENCE OF THERMAL DIFFUSION AND TEMPERATURE GRADIENT", Journal of Crystal growth, vol. 31, 1975, pp. 299-307.

However, if the above-described vertical structure is applied to a substrate processing apparatus configured to form a SiC epitaxial film so as to vertically stack a plurality of substrates and process the substrates at a time, there occur problems related with the decomposition temperature of a Si source gas. Although varying according to the composition of a Si source, the thermal decomposition temperature of monosilane ($SiH_4$) generally used as a silicon source is known to be about 950° C. to 1050° C., and even tetrachlorosilane ($SiCl_4$) including chlorine is known to be thermally decomposed at about 1150° C. to 1250° C. Generally, SiC is epitaxially grown at about 1500° C. to about 1800° C. Properties of Si source gases are exemplarily shown in FIG. 9.

In the case where the above-described vertical structure is applied to a substrate processing apparatus configured to form a SiC epitaxial film, a gas supply nozzle for supplying a Si source gas is installed in a reaction chamber in a manner such that the gas supply nozzle extends along a region where substrates are stacked for a batch process, that is, a region where substrates are arranged. For this reason, the inside temperature of the gas supply nozzle becomes equal to the inside temperature of the reaction chamber, that is, the inside temperature of the gas supply nozzle becomes higher than the decomposition temperature of the Si source gas. As a result, when the Si source gas is supplied into the reaction chamber, the Si source gas may decompose while passing through the gas supply nozzle, and thus the Si source gas may be insufficiently supplied into the reaction chamber. Moreover, due to the decomposition of the Si source gas, Si may be deposited on the inner wall of the gas supply nozzle; the inside of the gas supply nozzle may be clogged by deposited Si; an ejection hole formed in the gas supply nozzle may be clogged by deposited Si; and thus the Si source gas may not be supplied into the reaction chamber. In addition, Si deposited on the gas supply nozzle may enter the inside of the reaction chamber to contaminate the inside of the reaction chamber. In addition, since the inside temperature of the gas supply nozzle is higher than the melting point of extracted deposited Si, some of deposited Si may melt and flow to a substrate to cause a crystalline defect on the surface of the substrate.

SUMMARY OF THE INVENTION

An object of the present invention is to provide a semiconductor device manufacturing method and a substrate manufacturing method that are designed to suppress decomposition of a silicon (Si) source gas in a gas supply nozzle and deposition of Si on a part such as the inner wall of the gas supply nozzle when silicon carbide (SiC) epitaxial films are grown in a vertical type substrate processing apparatus, in which a plurality of substrates are vertically stacked in a reaction chamber and the gas supply nozzle disposed at the inside of the reaction chamber in a region where the substrates are arranged is heated to a temperature higher than the decomposition temperature of the Si source gas.

According to an aspect of the present invention, there is a semiconductor device manufacturing method comprising: loading a plurality of substrates stacked at predetermined intervals into a reaction chamber; forming silicon carbide films on the substrates by supplying at least a silicon-containing gas and a chlorine-containing gas or at least a gas containing silicon and chlorine into the reaction chamber from a first gas supply outlet of a first gas supply unit which is configured to supply a gas in a direction parallel to main surfaces of the substrates disposed in the reaction chamber, supplying at least a reducing gas into the reaction chamber from a second gas supply outlet of a second gas supply unit, and supplying at least a carbon-containing gas into the reaction chamber from the first gas supply outlet of the first gas supply unit or the second gas supply outlet of the second gas supply unit; and unloading the substrates from the reaction chamber.

According to another aspect of the present invention, there is provided a substrate manufacturing method comprising: loading a plurality of substrates stacked at predetermined intervals into a reaction chamber; forming silicon carbide films on the substrates by supplying at least a silicon-containing gas and a chlorine-containing gas or at least a gas containing silicon and chlorine into the reaction chamber from a first gas supply outlet of a first gas supply unit which is configured to supply a gas in a direction parallel to main surfaces of the substrates disposed in the reaction chamber, supplying at least a reducing gas into the reaction chamber from a second gas supply outlet of a second gas supply unit, and supplying at least a carbon-containing gas into the reaction chamber from the first gas supply outlet of the first gas supply unit or the second gas supply outlet of the second gas supply unit; and unloading the substrates from the reaction chamber.

BRIEF DESCRIPTION OF THE DRAWINGS

FIG. 1 is an exemplary schematic view illustrating a relationship between a structure of a pancake type susceptor and positions of substrates.

FIG. 2 is a perspective view illustrating a substrate processing apparatus 10 according to a first embodiment of the present invention.

FIG. 9 is an exemplary table showing properties of various Si source gases.

DETAILED DESCRIPTION OF THE PREFERRED EMBODIMENTS

<First Embodiment of Invention>

Figure 3:
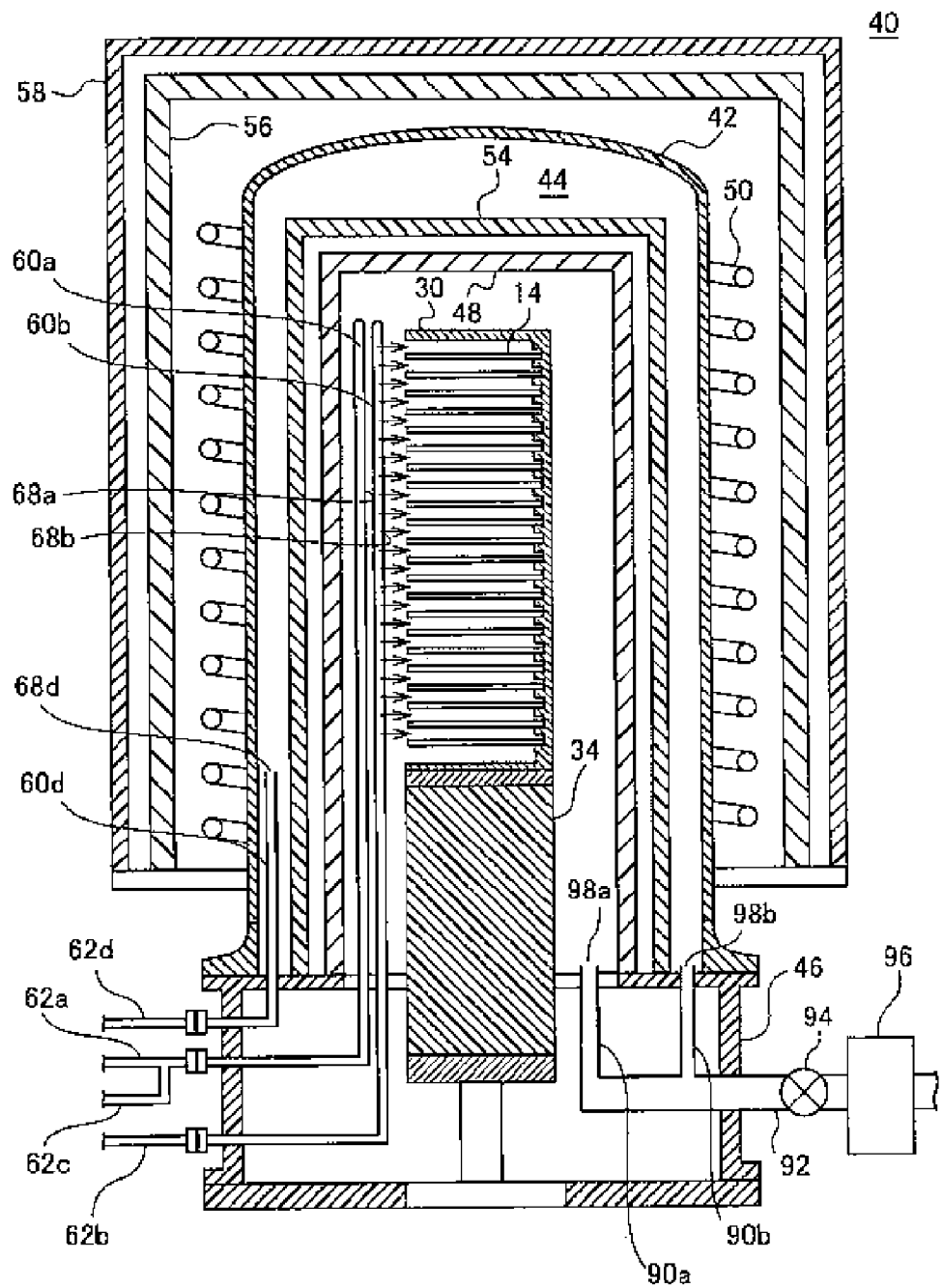
FIG. 3 is a side sectional view illustrating a process furnace 40 of the substrate processing apparatus 10 according to the first embodiment of the present invention.

Hereinafter, a first embodiment of the present invention will be described with reference to the attached drawings.

(1) Structure of Substrate Processing Apparatus

FIG. 2 is a perspective view illustrating an example of a substrate processing apparatus 10 configured to form a silicon carbide (SiC) according to the current embodiment. The substrate processing apparatus 10 is configured as a batch type vertical heat treatment apparatus. The substrate processing apparatus 10 includes a case 12 in which main parts such as a process furnace 40 are disposed. In the substrate processing apparatus 10, FOUPs (Front Opening Unified Pods, hereinafter referred to as pods) 16, which are substrate containers configured to accommodate substrates such as wafers 14 (refer to FIG. 2) made of silicon (Si) or silicon carbide (SiC), are used as wafer carriers. At the front side of the case 12 (right in FIG. 2), a pod stage 18 is disposed. Pods 16 are carried to and placed on the pod stage 18. For example, twenty five wafers 14 are accommodated in each pod 16. Each of the pods 16 is configured to be placed on the pod stage 18 in a state where a cap (not shown) of the pod 16 is closed.

At a front inner side of the case 12 opposite to the pod stage 18, a pod carrying device 20 is disposed. Near the pod carrying device 20, a pod shelf 22, a pod opener 24, and a substrate counter 26 are disposed. The pod shelf 22 is disposed above the pod opener 24 and is configured such that a plurality of pods 16 can be placed and held on the pod shelf 22. The substrate counter 26 is disposed close to the pod opener 24. The pod carrying device 20 is configured to carry a pod 16 among the pod stage 18, the pod shelf 22, and the pod opener 24. The pod opener 24 is used to open a cap of a pod 16. After the cap of the pod 16 is opened, the substrate counter 26 is used to count the number of wafers 14 disposed in the pod 16.

In the case 12, a substrate transfer machine 28 and a boat 30 being a substrate holding tool are disposed. The substrate transfer machine 28 includes an arm (tweezers) 32 capable of picking up wafers 14, for example, five wafers 14. By vertically rotating and horizontally rotating the arm 32 using a driving unit (not shown), wafers 14 can be carried between a pod 16 placed at the pod opener 24 and the boat 30.

The boat 30 is made of a heat-resistant material such as graphite or silicon carbide and is configured to hold a plurality of vertically stacked wafers 14 in a manner such that the wafers 14 are horizontally oriented and vertically arranged with the centers of the wafers 14 being aligned with each other. In addition, at the lower part of the boat 30, a boat insulating part 34 is disposed as a circular disk shaped insulating member made of a heat-resistant material such as quartz or silicon carbide, so as to prevent heat transfer from a susceptor 48 (described later) to the lower side of a process furnace 40 (refer to FIG. 3).

At the rear upper part in the case 12, the process furnace 40 is disposed. The process furnace 40 is configured so that the boat 30 in which a plurality of wafers 14 are held can be loaded into the process furnace 40 through the bottom side of the process furnace 40.

Figure 4:
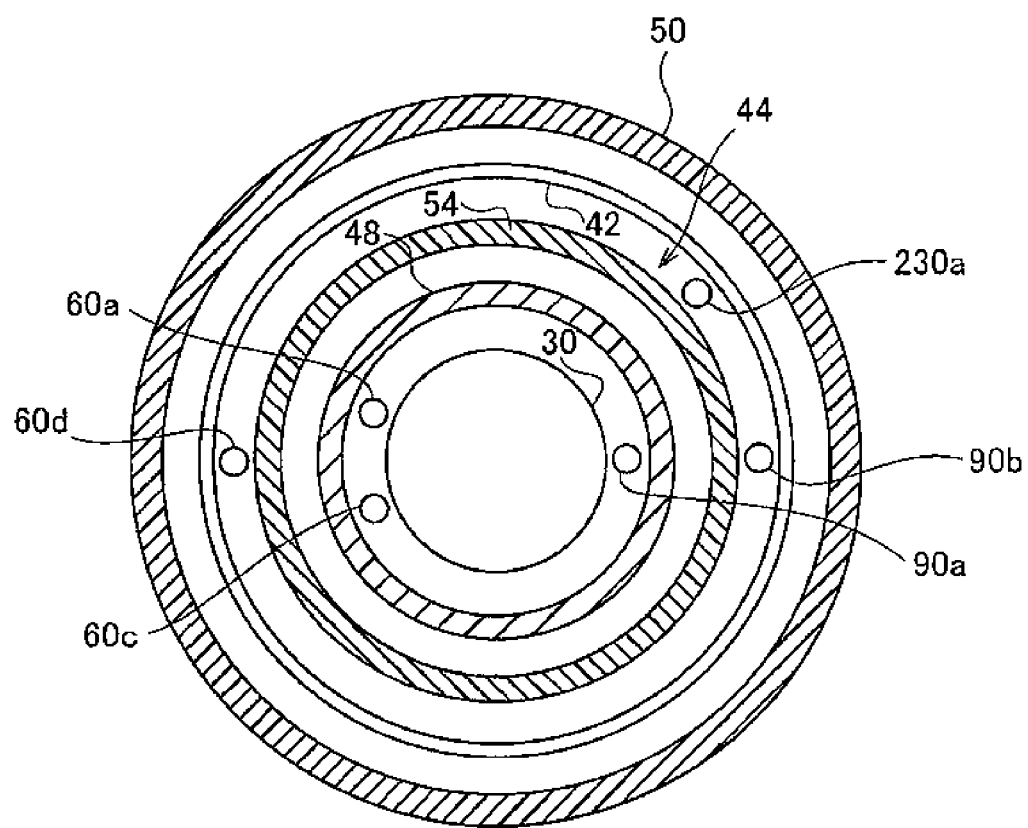
FIG. 4 is a cross-sectional view illustrating the process furnace 40 of the substrate processing apparatus 10 according to the first embodiment of the present invention.

FIG. 3 is a side sectional view illustrating the process furnace 40 of the substrate processing apparatus 10 according to the current embodiment, and FIG. 4 is a cross-sectional view illustrating the process furnace 40.

The process furnace 40 includes an outer tube 42 as a cylindrical reaction tube. The outer tube 42 is made of a heat-resistant material such as quartz ($SiO_2$) or silicon carbide (SiC) and has a cylindrical shape with a closed top side and an opened bottom side. In the cylindrical hollow part of the inside of the outer tube 42, a reaction chamber 44 is formed. The reaction chamber 44 is configured to accommodate vertically stacked wafers 14 made of a material such as silicon or silicon carbide, in a state where the wafers 14 are horizontally oriented and vertically arranged in the boat 30 with the centers of the wafers 14 being aligned with each other.

At the lower side of the outer tube 42, a manifold 46 is installed concentrically with the outer tube 42. The manifold 46 is made of a material such as stainless steel and has a cylindrical shape with opened top and bottom sides. The manifold 46 is installed to support the outer tube 42 from the bottom side of the outer tube 42. In addition, between the manifold 46 and the outer tube 42, an O-ring is installed as a seal member. The manifold 46 is supported by a holder (not shown) so that the outer tube 42 can be vertically fixed. A reaction vessel is mainly constituted by the outer tube 42 and the manifold 46.

The process furnace 40 includes the susceptor 48 as a heating part, and a magnetic coil (induction coil) 50 as a magnetic field generating unit. The susceptor 48 has a cylindrical shape and is installed in the reaction chamber 44 in a manner such that the susceptor 48 surrounds the wafers 14 held in the boat 30. The magnetic coil 50 is installed outside the outer tube 42 to surround the outer tube 42. The susceptor 48 is configured to generate heat in response to a magnetic field generated by the magnetic coil 50. As the susceptor 48 generates heat, the inside of the reaction chamber 44 is heated by radiation heat.

Near the susceptor 48, a temperature sensor (not shown) is installed as a temperature detector configured to detect the inside temperature of the reaction chamber 44. The magnetic coil 50 and the temperature sensor are electrically connected to a temperature control unit 52 (refer to FIG. 6). The temperature control unit 52 is configured to adjust power supply to the magnetic coil 50 based on temperature information detected by the temperature sensor so as to obtain desired temperature distribution in the reaction chamber 44 at a desired time.

Between the susceptor 48 and the outer tube 42, an inner insulating wall 54 to prevent heat transfer from the susceptor 48 to the outer tube 42 or/and the outside of the outer tube 42. In addition, at the outside of the magnetic coil 50, an outer insulating wall 56 having a structure such as a water cooling structure is installed in a manner such that the outer insulating wall 56 encloses the reaction chamber 44 so as to prevent heat transfer from the inside of the reaction chamber 44 to the outside area. In addition, at the outside of the outer insulating wall 56, an electric field seal 58 is installed to prevent leakage of a magnetic field generated by the magnetic coil 50 to the outside area.

A first gas supply nozzle 60a, a second gas supply nozzle 60b, and a fourth gas supply nozzle 60d are connected to the manifold 46 as a first gas supply unit, a second gas supply unit, and a fourth gas supply unit. Each of the first gas supply nozzle 60a, the second gas supply nozzle 60b, and the fourth gas supply nozzle 60d is L-shaped. Each of the upstream sides of the first gas supply nozzle 60a, the second gas supply nozzle 60b, and the fourth gas supply nozzle 60d penetrates the sidewall of the manifold 46 in a horizontal direction. The downstream sides of the first and second gas supply nozzles 60a and 60b are erected along the inner wall of the susceptor 48 and extended to about the upper end of the boat 30. The downstream side of the fourth gas supply nozzle 60d is erected along the inner wall of the outer tube 42 and extended to about the lower end of the boat 30. Gas flow passages are formed in the first gas supply nozzle 60a, the second gas supply nozzle 60b, and the fourth gas supply nozzle 60d, respectively.

In the sidewalls of the vertical parts of the first and second gas supply nozzles 60a and 60b, first gas supply holes 68a and second gas supply holes 68b are formed as first gas supply outlets and second gas supply outlets in a manner such that the first and second gas supply holes 68a and 68b are vertically arranged, so as to supply gas to main surfaces of the wafers 14 held in the boat 30 in a horizontal direction. In addition, at the downstream side of the fourth gas supply nozzle 60d, a fourth gas supply hole 68d is formed as a fourth gas supply outlet to supply gas in a vertical direction. By providing as many first gas supply holes 68a as the number of the wafers 14 held in the boat 30 and as many second gas supply holes 68b as the number of the wafers 14 held in the boat 30, the uniformity of in-surface film thicknesses of the wafers 14 can be easily controlled, and thus this structure may be preferable.

The downstream side of a first gas supply pipe 62a which is configured to supply at least tetrachlorosilane ($SiCl_4$) gas as a gas containing silicon and chlorine is joined with the downstream side of a third gas supply pipe 62c which is configured to supply at least propane ($C_3H_8$) gas as a gas containing carbon, and the joined first and third gas supply pipes 62a and 62c are connected to the upstream side of the first gas supply nozzle 60a. In addition, the downstream side of a second gas supply pipe 62b which is configured to supply at least hydrogen ($H_2$) gas as a reducing gas is connected to the upstream side of the second gas supply nozzle 60b. In addition, the downstream side of a fourth gas supply pipe 62d which is configured to supply at least a rare gas such as argon (Ar) as a purge gas is connected to the upstream side of the fourth gas supply nozzle 60d.

Figure 12:
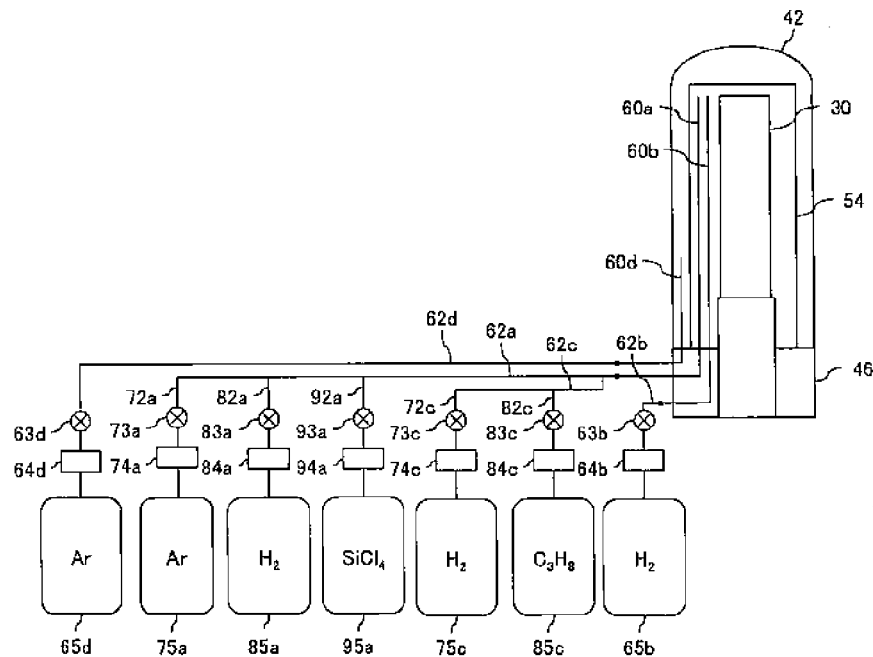
FIG. 12 is an exemplary view illustrating a gas supply system of the substrate processing apparatus 10 according to the first embodiment of the present invention.

The structures of the first to fourth gas supply pipes 62a, 62b, 62c, and 62d are illustrated in FIG. 12.

The downstream end of an Ar gas supply pipe 72a configured to supply Ar gas as a carrier gas; the downstream end of a $H_2$ gas supply pipe 82a configured to supply a gas containing hydrogen such as $H_2$ gas as a carrier gas (or a reducing gas); and the downstream end of a $SiCl_4$ gas supply pipe 92a configured to supply $SiCl_4$ gas as a gas containing silicon and chlorine are connected to the upstream side of the first gas supply pipe 62a. At the Ar gas supply pipe 72a, an Ar gas supply source 75a, a mass flow controller (MFC) 74a as a gas flow rate control device, and a valve 73a are sequentially installed from the upstream side of the Ar gas supply pipe 72a. At the $H_2$ gas supply pipe 82a, a $H_2$ gas supply source 85a, an MFC 84a, and a valve 83a are sequentially installed from the upstream side of the $H_2$ gas supply pipe 82a. At the $SiCl_4$ gas supply pipe 92a, a $SiCl_4$ gas supply source 95a, an MFC 94a, and a valve 93a are sequentially installed from the upstream side of the $SiCl_4$ gas supply pipe 92a.

At the second gas supply pipe 62b, a $H_2$ gas supply source 65b, an MFC 64b as a gas flow rate control device, and a valve 63b are sequentially installed from the upstream side of the second gas supply pipe 62b.

The downstream end of a $H_2$ gas supply pipe 72c configured to supply a gas containing hydrogen such as $H_2$ gas as a carrier gas (or a reducing gas), and the downstream end of a $C_3H_8$ gas supply pipe 82c configured to supply propane ($C_3H_8$) gas as a gas containing carbon are connected to the upstream side of the third gas supply pipe 62c. At the $H_2$ gas supply pipe 72c a $H_2$ gas supply source 75c, an MFC 74c as a gas flow rate control device, and a valve 73c are sequentially installed from the upstream side of the $H_2$ gas supply pipe 72c. At the $C_3H_8$ gas supply pipe 82c, a $C_3H_8$ gas supply source 85c, an MFC 84c, and a valve 83c are sequentially installed from the upstream side of the $C_3H_8$ gas supply pipe 82c.

At the fourth gas supply pipe 62d, an Ar gas supply source 65d, an MFC 64d as a gas flow rate control device, and a valve 63d are installed sequentially from the upstream side of the fourth gas supply pipe 62d.

A gas flow rate control unit 78 (refer to FIG. 6) is electrically connected to the valves 73a, 83a, 93a, 63b, 73c, 83c, and 63d, and the MFCs 74a, 84a, 94a, 64b, 74c, 84c, and 64d. The gas flow rate control unit 78 is configured to control the supply flow rates of gases so as to obtain desired flow rates at desired times (refer to FIG. 6).

A first gas supply system of the current embodiment is constituted mainly by the first gas supply pipe 62a, the Ar gas supply pipe 72a, the $H_2$ gas supply pipe 82a, the $SiCl_4$ gas supply pipe 92a, the Ar gas supply source 75a, the $H_2$ gas supply source 85a, the $SiCl_4$ gas supply source 95a, the MFCs 74a, 84a, and 94a, and the valves 73a, 83a, and 93a. In addition, a second gas supply system of the current embodiment is constituted mainly by the second gas supply pipe 62b, the $H_2$ gas supply source 65b, the MFC 64b, and the valve 63b. In addition, a third gas supply system of the current embodiment is constituted mainly by the third gas supply pipe 62c, the $H_2$ gas supply pipe 72c, the $C_3H_8$ gas supply pipe 82c, the Ar gas supply source 75a, the $H_2$ gas supply source 75c, the $C_3H_8$ gas supply source 85c, the MFCs 74c and 84c, and the valves 73c and 83c. In addition, a fourth gas supply system of the current embodiment is constituted mainly by the fourth gas supply pipe 62d, the Ar gas supply source 65d, the MFC 64d, and the valve 63d. Furthermore, in the current embodiment, the third gas supply pipe 62c, which constitutes the third gas supply system configured to supply at least a gas containing carbon, is connected to the first gas supply nozzle 60a which is a first gas supply unit.

As shown in FIG. 3, an exhaust pipe 92 is installed in the manifold 46 at a position facing the first and second gas supply nozzles 60a and 60b. The exhaust pipe 92 penetrates the sidewall of the manifold 46. The downstream end of a first gas exhaust nozzle 90a and the downstream end of a second gas exhaust nozzle 90b are connected to the upstream side of the exhaust pipe 92. At the upstream end of the first gas exhaust nozzle 90a, a first gas exhaust outlet 98a is formed in a manner such that the first gas exhaust outlet 98a is opened toward the lower region of the inner space of the susceptor 48. At the upstream end of the second gas exhaust nozzle 90b, a second gas exhaust outlet 98b is formed in a manner such that the second gas exhaust outlet 98b is opened toward the lower region of a space between the inner insulating wall 54 and the outer tube 42. At the downstream side of the exhaust pipe 92, a pressure sensor (not shown) is installed as a pressure detector, an auto pressure controller (APC) valve 94 is installed as a pressure regulator, and a vacuum exhaust device such as a vacuum pump is installed. A pressure control unit 98 (refer to FIG. 6) is electrically connected to the pressure sensor and the APC valve 94. Based on a pressure detected by the pressure sensor, the pressure control unit 98 controls the opening degree of the APC valve 94 so as to keep the inside of the reaction chamber 44 at a desired pressure at a desire time.

Owing to the above-described structure, gases supplied through the first and second gas supply nozzles 60a and 60b can flow in parallel to the main surfaces of the wafers 14, and then the gases can be discharged to the outside of the reaction chamber 44 mainly through the first gas exhaust outlet 98a. Therefore, the wafers 14 made of a material such as silicon or silicon carbide can be efficiently and uniformly exposed to the gases. Gas supplied through the second gas supply nozzle 60b is diffused in the reaction chamber 44 and is then discharged to the outside of the reaction chamber 44 mainly through the first gas exhaust outlet 98a. Owing to this, gas composition ratios in the first gas supply nozzle 60a and the reaction chamber 44 can be properly adjusted. That is, as described later, the ratio of $SiCl_4$ gas partial pressure/$H_2$ gas partial pressure ($P_{SiCl4}/P_{H2}$) can be adjusted to a proper value independently in the first gas supply nozzle 60a and the reaction chamber 44.

In addition, gas ejected through the fourth gas supply hole 68d purges the space between the outer tube 42 and the inner insulating wall 54 and is then discharged to the outside of the reaction chamber 44 mainly through the second gas exhaust outlet 98b. Owing to this, gases supplied through the first and second gas supply nozzles 60a and 60b can be prevented from flowing into the space between the outer tube 42 and the inner insulating wall 54, and adhesion of unnecessary byproducts onto the inner wall of the outer tube 42 can be prevented.

Figure 5:
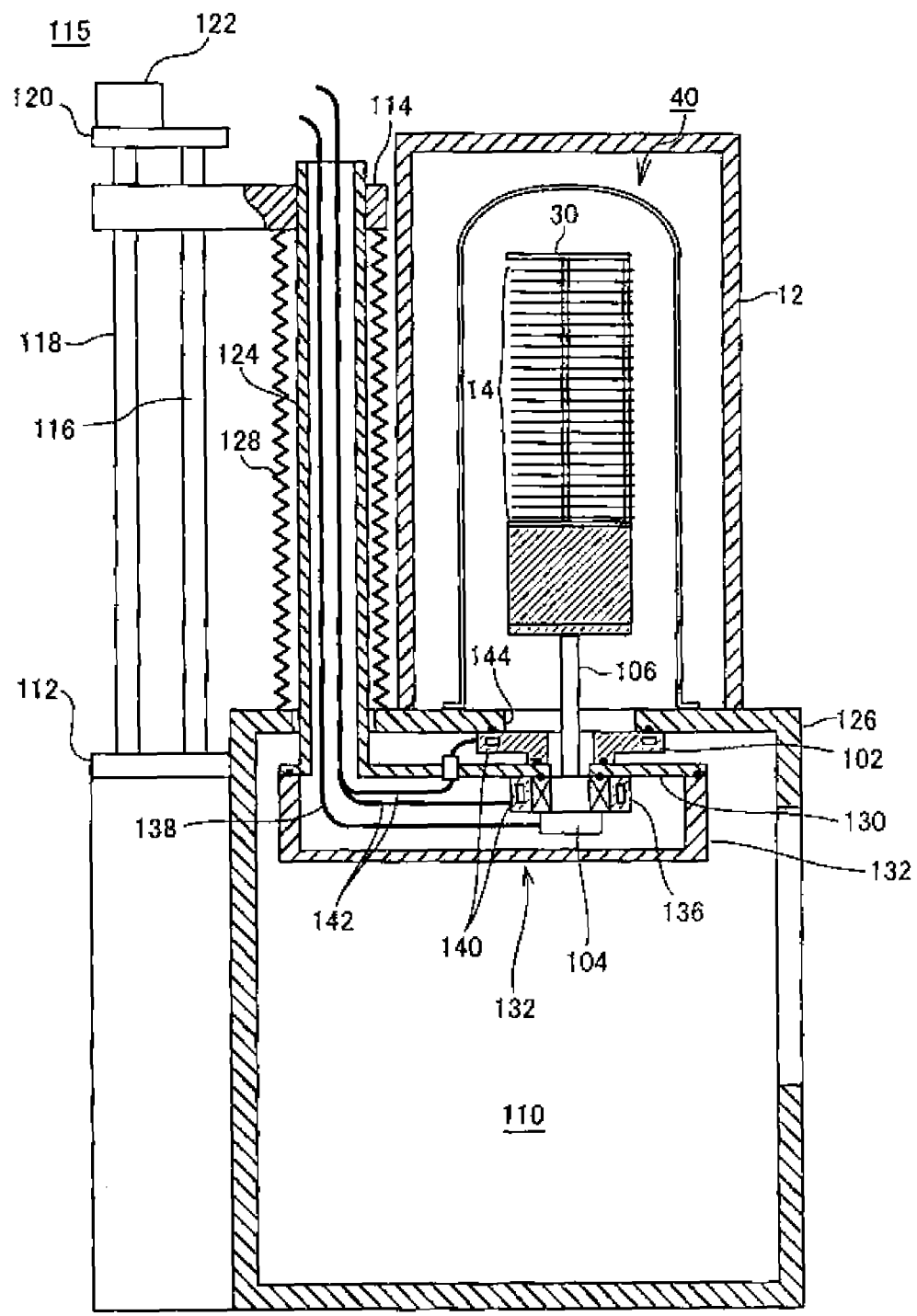
FIG. 5 is a schematic view illustrating the process furnace 40 of the substrate processing apparatus 10 and the peripheral structure of the process furnace 40 according to the first embodiment of the present invention.

FIG. 5 is a schematic view illustrating the process furnace 40 and the peripheral structure of the process furnace 40 according to the current embodiment.

As shown in FIG. 5, under the process furnace 40, a loadlock chamber 110 is installed as a preliminary chamber. At the outer surface of the sidewall of the loadlock chamber 110, a boat elevator 115 is installed. The boat elevator 115 includes a lower base plate 112, a guide shaft 116, a ball screw 118, an upper base plate 120, an elevating motor 122, an elevating base plate 130, and a bellows 128. The lower base plate 112 is horizontally fixed to the outer surface of the sidewall of the loadlock chamber 110. The guide shaft 116 fitted in the elevating table 114, and the ball screw 118 screw-coupled with the elevating table 114 are installed on the lower base plate 112 in perpendicular to the lower base plate 112. The upper base plate 120 is horizontally fixed to the upper ends of the guide shaft 116 and the ball screw 118. The ball screw 118 is configured to be rotated by the elevating motor 122 installed on the upper base plate 120. The guide shaft 116 is configured to allow vertical movements of the elevating table 114 and restrict horizontal rotation of the elevating table 114. By rotating the ball screw 118, the elevating table 114 can be raised and lowered.

A hollow elevating shaft 124 is vertically fixed to the elevating table 114. A joint part between the elevating table 114 and the elevating shaft 124 is hermetically maintained. The elevating shaft 124 and the elevating table 114 are configured to be lifted and lowered together with each other. The lower end of the elevating shaft 124 penetrates a top plate 126 of the loadlock chamber 110. The inner diameter of a penetration hole formed in the top plate 126 of the loadlock chamber 110 is greater than the outer diameter of the elevating shaft 124 so as to prevent the elevating shaft 124 and the top plate 126 from making contact with each other. Between the loadlock chamber 110 and the elevating table 114, the stretchy bellows 128 is installed so as to enclose the elevating shaft 124 as a hollow stretchy part. A joint part between the elevating table 114 and the bellows 128 and a joint part between the top plate 126 and the bellows 128 are hermetically maintained so that the inside of the loadlock chamber 110 can be hermetically maintained. The bellows 128 can be sufficiently expanded and contracted in accordance with ascending and descending motions of the elevating table 114. The bellows 128 has an inner diameter sufficiently greater than the outer diameter of the elevating shaft 124 so as not to make contact with the elevating shaft 124.

The elevating base plate 130 is horizontally fixed to the lower end of the elevating shaft 124 protruding into the loadlock chamber 110. A joint part between the elevating shaft 124 and the elevating base plate 130 is hermetically maintained. A seal cap 102 is hermetically installed on the top surface of the elevating base plate 130 in a state where a seal member such as an O-ring is disposed between the seal cap 102 and the elevating base plate 130. The seal cap 102 is made of a metal such as stainless steel and has a circular disk shape. By operating the elevating motor 122 to rotate the ball screw 118, the elevating table 114, the elevating shaft 124, the elevating base plate 130, and the seal cap 102 can be lifted in order to load the boat 30 into the reaction chamber 44 (boat loading) and close an opening part (furnace port) of the process furnace 40 by the seal cap 102. In addition, by operating the elevating motor 122 to rotate the ball screw 118, the elevating table 114, the elevating shaft 124, the elevating base plate 130, and the seal cap 102 can be lowered in order to unload the boat 30 from the inside of the reaction chamber 44 (boat unloading). A driving control unit 108 (refer to FIG. 6) is electrically connected to the elevating motor 122. The driving control unit 108 controls the boat elevator 115 so that a desired operation of the boat elevator 115 can be performed at a desired time.

A driving unit cover 132 is hermetically attached to the bottom surface of the elevating base plate 130 with a seal member such as an O-ring being disposed therebetween. The elevating base plate 130 and the driving unit cover 132 constitute a driving unit accommodation case 134. The inside of the driving unit accommodation case 134 is isolated from the inside atmosphere of the loadlock chamber 110. In the driving unit accommodation case 134, a rotary mechanism 104 is installed. A power supply cable 138 is connected to the rotary mechanism 104. The power supply cable 138 extends from the upper end of the elevating shaft 124 to the rotary mechanism 104 through the inside of the elevating shaft 124, so as to supply power to the rotary mechanism 104. The upper end part of a rotation shaft 106 of the rotary mechanism 104 penetrates the seal cap 102 and supports the bottom side of the boat 30 functioning as a substrate holding tool. By operating the rotary mechanism 104, the wafers 14 held in the boat 30 can be rotated in the reaction chamber 44. The driving control unit 108 (refer to FIG. 6) is electrically connected to the rotary mechanism 104. The driving control unit 108 controls the rotary mechanism 104 so that a desired operation of the rotary mechanism 104 can be performed at a desired time.

In addition, a cooling mechanism 136 is installed around the rotary mechanism 104 in the driving unit accommodation case 134. Cooling passages 140 are formed in the cooling mechanism 136 and the seal cap 102. Coolant conduits 142 are connected to the cooling passages 140 to supply coolant. The coolant conduits 142 extend from the upper end of the elevating shaft 124 to the cooling passages 140 through the inside of the elevating shaft 124, so as to supply coolant to the cooling passages 140, respectively.

Figure 6:
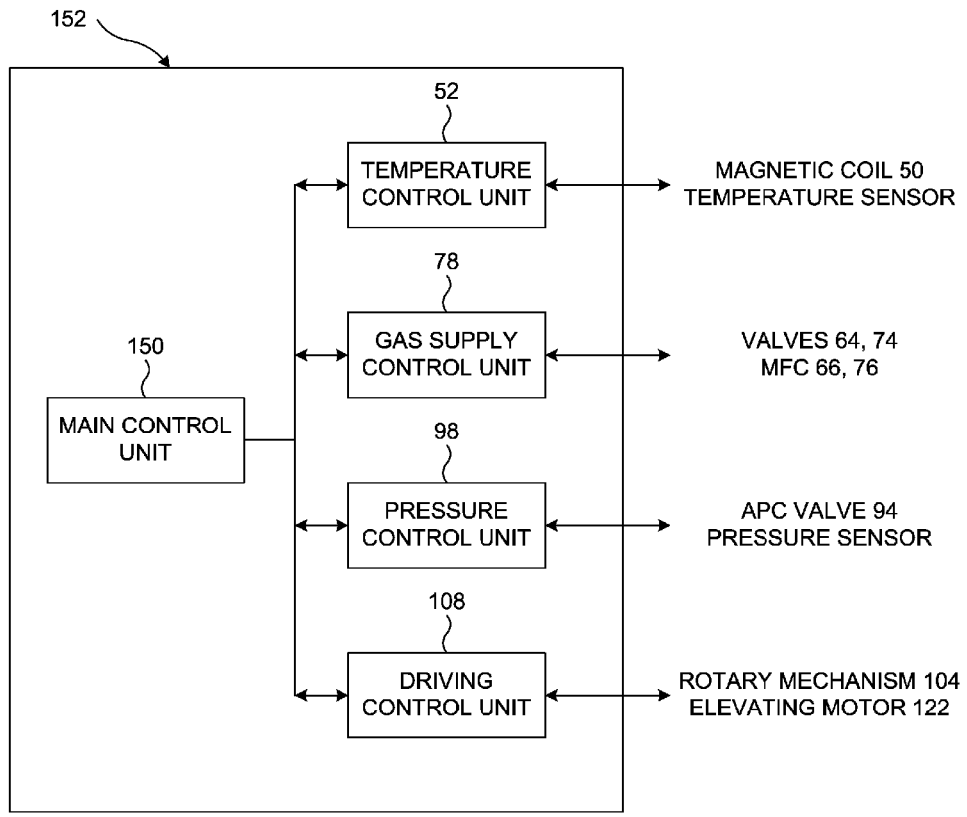
FIG. 6 is an exemplary block diagram illustrating a configuration for controlling each part of the substrate processing apparatus 10 according to the first embodiment of the present invention.

FIG. 6 is a block diagram illustrating a configuration for controlling each part of the substrate processing apparatus 10. A controller (control unit) 152 includes the temperature control unit 52, the gas flow rate control unit 78, the pressure control unit 98, the driving control unit 108, and a main control unit 150. The main control unit 150 constitutes a manipulation unit and an input/output unit and controls the overall operation of the substrate processing apparatus 10. The temperature control unit 52, the gas flow rate control unit 78, the pressure control unit 98, and the driving control unit 108 are electrically connected to the main control unit 150.

(2) Substrate Processing Process

Next, an explanation will be given on a method of forming a film such as SiC (silicon carbide) film on a substrate such as a silicon or silicon carbide wafer 14 by using the above-described substrate processing apparatus 10 in one of semiconductor device manufacturing processes.

In the current embodiment, as described later, a SiC film is formed by supplying a gas mixture (first gas mixture) of $SiCl_4$ gas, $H_2$ gas, and $C_3H_8$ gas through the first gas supply nozzle 60a and supplying $H_2$ gas through the second gas supply nozzle 60b. In the following description, operations of parts of the substrate processing apparatus 10 are controlled by the controller 152.

(Wafer Loading Operation S1)

First, a pod 16 accommodating a plurality of wafers 14 is placed on the pod stage 18. Next, the pod carrying device 20 transfers the pod 16 from the pod stage 18 to the pod shelf 22. Next, the pod carrying device 20 carries the pod 16 from the pod shelf 22 to the pod opener 24. Next, the pod opener 24 opens a cap of the pod 16, and the substrate counter 26 detects the number of the wafers 14 accommodated in the pod 16.

Next, the substrate transfer machine 28 picks up wafers 14 from the pod 16 placed on the pod opener 24 and transfers the wafers 14 to the boat 30. After a plurality of wafers 14 are charged into the boat 30, the boat 30 in which the wafers 14 is held is loaded into the reaction chamber 44 (boat loading) as the elevating table 114 and the elevating shaft 124 are lifted by the elevating motor 122. At this time, the bottom side of the manifold 46 is sealed by the seal cap 102 in a state where the O-ring being disposed between the manifold 46 and the seal cap 102.

(Pressure adjusting process S2 and Temperature increasing operation S3)

The inside of the reaction chamber 44 is vacuum-evacuated by the vacuum exhaust device 96 to a predetermined pressure (vacuum degree). At this time, the inside pressure of the reaction chamber 44 is measured by using the pressure sensor, and based on the measured pressure, the APC valve 94 installed at the exhaust pipe 92 is feedback-controlled (S2).

In addition, alternating current (AC) power (for example, 10 KHz to 100 KHz, 10 KW to 200 KW) is supplied from an AC power supply (not shown) to the magnetic coil 50 to apply an AC magnetic field to the susceptor 48 and thus to generate an induction current in the susceptor 48 for heating the susceptor 48. Then, the wafers 14 held in the boat 30 and the inside of the reaction chamber 44 are heated to a temperature ranging from 1500° C. to 1800° C. by radiation heat from the susceptor 48. At this time, to obtain desired temperature distribution in the reaction chamber 44, power to the magnetic coil 50 is feedback-controlled based on temperature information detected by the temperature sensor (S3). At this time, the insides of the first and second gas supply nozzles 60a and 60b are also heated to, for example, 1500° C. to 1800° C.

Subsequently, the rotary mechanism 104 starts to rotate the boat 30 and the wafers 14. The wafers 14 are rotated until the wafers 14 are unloaded in a later-described unloading operation.

(Gas Supply Operation S4)

Next, the valves 83a and 93a are opened, and hydrogen (H$_2$) gas which is a reducing gas and tetrachlorosilane (SiCl$_4$) gas which is a gas containing silicon and chlorine are introduced into the reaction chamber 44 through the first gas supply pipe 62a, the first gas supply nozzle 60a, and the first gas supply holes 68a while controlling the flow rates of the gases by using the MFCs 84a and 94a. In addition, the valves 73c and 83c are opened, and hydrogen (H$_2$) gas which is a reducing gas and propane (C$_3$H$_8$) gas which is a carbon-containing gas are supplied into the reaction chamber 44 through the third gas supply pipe 62c, the first gas supply nozzle 60a, and the first gas supply holes 68a while controlling the flow rates of the gases by using the MFCs 74c and 84c.

Furthermore, at this time, the valve 63b is opened, and H$_2$ gas which is a reducing gas is supplied into the reaction chamber 44 through the second gas supply pipe 62b, the second gas supply nozzle 60b, and the second gas supply holes 68b while controlling the flow rate of the H$_2$ gas by using the MFC 64b.

The gases supplied into the reaction chamber 44 through the first and second gas supply nozzles 60a and 60b are mixed with each other and flow in parallel to main surfaces of the wafers 14, and then the gases are discharged to the outside of the reaction chamber 44 mainly through the first gas exhaust outlet 98a. When the gases supplied through the first and second gas supply nozzles 60a and 60b flow through the inside of the reaction chamber 44, the gases make contact with the wafers 14, and thus SiC films are epitaxially grown on the wafers 14.

As described above, according to the current embodiment, when a gas mixture of SiCl$_4$ gas, H$_2$ gas, and C$_3$H$_8$ gas is supplied into the reaction chamber 44 through the first gas supply nozzle 60a, H$_2$ gas is supplied into the reaction chamber 44 through the second gas supply nozzle 60b. That is, the ratio of SiCl$_4$ gas partial pressure/H$_2$ gas partial pressure ($P_{SiCl4}/P_{H2}$) can be adjusted to a proper value independently in the first gas supply nozzle 60a and the reaction chamber 44. As a result, it is possible to restrain decomposition of the SiCl$_4$ gas in the first gas supply nozzle 60a and deposition of Si on the inner wall of the first gas supply nozzle 60a, and SiC films can be grown on the wafers 14. This will be described in more detail.

In addition, when gases are being supplied through the first and second gas supply nozzles 60a and 60b, the valve 63d is opened, so as to supply Ar gas to a space between the outer tube 42 and the inner insulating wall 54 through the fourth gas supply pipe 62d and the fourth gas supply nozzle 60d while controlling the flow rate of the Ar gas by using the MFC 64d. The Ar gas supplied through the fourth gas supply nozzle 60d flows through an inner region of the reaction chamber 44 located outside of the inner insulating wall 54, and then the Ar gas is discharged to the outside of the reaction chamber 44 mainly through the second gas exhaust outlet 98b. Owing to this, the gases supplied through the first and second gas supply nozzles 60a and 60b can be prevented from flowing into the space between the outer tube 42 and the inner insulating wall 54, and adhesion of unnecessary byproducts onto parts such as the inner wall of the outer tube 42 can be prevented.

(Temperature Decreasing Operation S5 and Atmospheric Pressure Return Operation S6)

After going through a predetermined epitaxial growth time, supply of AC power to the magnetic coil 50 is stopped. Thereafter, the susceptor 48, the boat 30, and the wafers 14 are cooled to a predetermined temperature (for example, about 600° C.) (S5).

In addition, the valves 83a, 93a, 63b, 73c, and 83c are closed to stop supply of SiCl$_4$ gas, H$_2$ gas, and C$_3$H$_8$ gas, and along with this, the valve 73a is opened to start supply of inert gas such as Ar gas into the reaction chamber 44 so as to replace the inside atmosphere of the reaction chamber 44 with the Ar gas and adjust the inside pressure of the reaction chamber 44 to atmospheric pressure (S6).

(Wafer Unloading Operation S7)

After that, the seal cap 102 is lowered by using the elevating motor 122 so as to open the bottom side of the manifold 46 and unload the boat 30 in which the processed wafers 14 are held to the outside of the outer tube 42 through the opened bottom side of the manifold 46 (boat unloading). Then, the boat 30 is left at a predetermined position until all the wafers 14 held in the boat 30 are cooled to a predetermined temperature (for example, about room temperature). If the wafers 14 are cooled to the predetermined temperature, the substrate transfer machine 28 picks up the wafers 14 from the boat 30 and carries the wafers 14 into an empty pod 16 placed on the pod opener 24. Thereafter, the pod carrying device 20 carries the pod 16 in which the wafers 14 are accommodated to the pod shelf 22 or the pod stage 18. In this way, the substrate processing process of the current embodiment is completed.

Furthermore, in the substrate processing process of the current embodiment, the following exemplary process conditions may be used.

Process temperature: 1500° C. to 1700° C.,
Process pressure: 10 Torr to 200 Torr,
SiCl$_4$ gas supply rate (total): 0.1 SLM to 1.0 SLM,
C$_3$H$_8$ gas supply rate (total): 0.1 SLM to 1.0 SLM, and
H$_2$ gas supply rate (total): 100 SLM to 200 SLM While maintaining the respective process conditions at constant values within the respective ranges, SiC films are epitaxially grown on the wafers 14.

In the substrate processing process of the current embodiment, the following exemplary process conditions may be used.

Process temperature: 1500° C. to 1700° C.,
Process pressure: 1 Torr to 100 Torr,
SiCl$_4$ gas supply rate (total): 0.1 SLM to 1.0 SLM,
C$_3$H$_8$ gas supply rate (total): 0.1 SLM to 1.0 SLM, and $H_2$ gas supply rate (total): 100 SLM to 200 SLM While maintaining the respective process conditions at constant values within the respective ranges, SiC films are epitaxially grown on the wafers 14. In addition, it is possible to further increase the rate of the film formation if the process pressure is set to the above-mentioned pressure.

(3) Restraining of Decomposition of Gas and Deposition

As described above, in the current embodiment, when a gas mixture (first gas mixture) of $SiCl_4$ gas, $H_2$ gas, and $C_3H_8$ gas is supplied into the reaction chamber 44 through the first gas supply nozzle 60a, $H_2$ gas is supplied into the reaction chamber 44 through the second gas supply nozzle 60b That is, the ratio of $SiCl_4$ gas partial pressure/$H_2$ gas partial pressure ($P_{SiCl4}/P_{H2}$) can be adjusted to a proper value independently in the first gas supply nozzle 60a and the reaction chamber 44.

Figure 7:
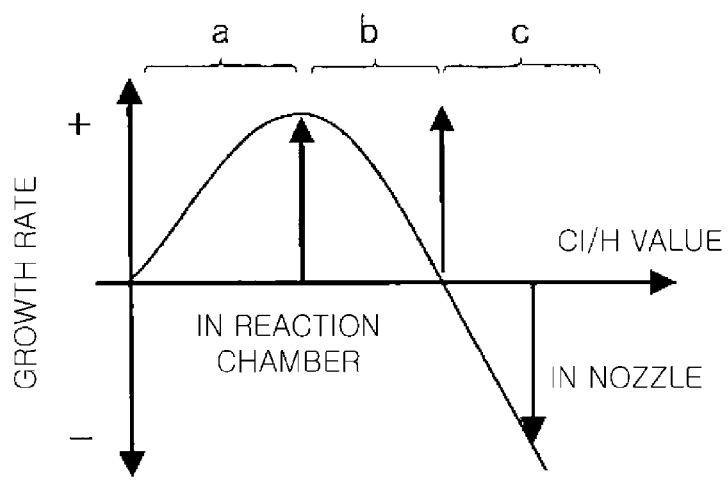
FIG. 7 is an exemplary graph showing a relationship between a growth rate and a gas concentration in a $SiCl_4$ gas-$H_2$ gas reaction system.

The ratio of the number of chlorine (Cl) atoms/the number of hydrogen (H) atoms (hereinafter, referred to as a Cl/H value) in the gas mixture of $SiCl_4$ gas and $H_2$ gas has relation to the rate of Si deposition (growth) caused by a reaction between $SiCl_4$ gas and $H_2$ gas as shown in FIG. 7. FIG. 7 is an exemplary graph showing a relationship between a growth rate and a gas concentration in a $SiCl_4$ gas-$H_2$ gas reaction system.

In FIG. 7, the horizontal axis denotes a Cl/H value of a gas mixture, and the vertical axis denotes a film growth rate caused by Si deposition. As shown in FIG. 7, as the Cl/H value increases gradually from zero, that is, as the concentration of $SiCl_4$ gas increases gradually relative to the concentration of $H_2$ gas or the supply amount of $SiCl_4$ gas increases gradually, the film growth rate caused by Si deposition increases gradually in the positive (+) direction (in the region (a) of FIG. 7). Then, as the concentration of $SiCl_4$ gas increases much more relative to the concentration of $H_2$ gas or the supply amount of $SiCl_4$ gas increases much more, the film growth rate decreases gradually (in the region (b) of FIG. 7). Then, as the concentration of $SiCl_4$ gas increases much more relative to the concentration of $H_2$ gas or the supply amount of $SiCl_4$ gas increases much more, the film growth rate decreases gradually in the negative (−) direction (in the range (c) of FIG. 7), that is, a Si film formed by deposition is etched (in the range (c) in FIG. 7).

This reaction can be expressed by the reaction formula: $SiCl_4+2H_2 \rightarrow Si+4HCl$. According to a detailed reaction calculation, if the Cl/H value is smaller than a predetermined value (for example, in the ranges (a) and (b) of FIG. 7), decomposition of $SiCl_4$ caused by a hydrogen reduction reaction proceeds at a higher rate so that the chemical equilibrium shifts in a direction where Si deposition and deposition occurs. On the other hand, if the Cl/H value is higher than the predetermined value (for example, in the range (c) of FIG. 7), decomposition of $SiCl_4$ caused by a hydrogen reduction reaction is suppressed, so that the chemical equilibrium shifts in a direction where etching of Si by HCl produced by reaction between H atoms and Cl atoms is carried out at a higher rate than the rate of Si deposition.

By using the $SiCl_4$—$H_2$ reaction equilibrium, that is, by adjusting the Cl/H values of the inside of the first gas supply nozzle 60a and the inside of the reaction chamber 44 to be different, a SiC film can be grown on a wafer 14 while suppressing decomposition of $SiCl_4$ gas in the first gas supply nozzle 60a and Si deposition on the inner wall of the first gas supply nozzle 60a.

That is, in the current embodiment, when a gas mixture of $SiCl_4$ gas, $H_2$ gas, and $C_3H_8$ gas is supplied from the first gas supply nozzle 60a into the reaction chamber 44, the concentration or supply flow rate of the $H_2$ gas is kept small relative to that of the $SiCl_4$ gas. In other words, the Cl/H value of the inside of the first gas supply nozzle 60a is set to be greater than the Cl/H value of the inside of the reaction chamber 44, like in the range (c) of FIG. 7. By this, in the first gas supply nozzle 60a, decomposition of $SiCl_4$ caused by a hydrogen reduction reaction may be suppressed, and an etching reaction of Si by HCl may occur at a higher rate than the rate of Si deposition, so that deposition of Si on the inner wall of the first gas supply nozzle 60a can be suppressed.

Furthermore, in the current embodiment, when a gas mixture of $SiCl_4$ gas, $H_2$ gas, and $C_3H_8$ gas is supplied from the first gas supply nozzle 60a into the reaction chamber 44, $H_2$ gas is supplied from the second gas supply nozzle 60b into the reaction chamber 44. That is, the Cl/H value of the inside of the reaction chamber 44 is set to be smaller than the Cl/H value of the inside of the first gas supply nozzle 60a, like in the ranges (a) and (b) of FIG. 7. Preferably, the Cl/H value of the inside of the reaction chamber 44 is set to a vale where a maximum film growth rate can be obtained. By this, in the reaction chamber 44, decomposition of $SiCl_4$ gas caused by a hydrogen reduction reaction may be facilitated, and a Si deposition reaction may occur at a rate higher than the rate of a Si etching reaction, so that a SiC epitaxial film can be efficiently grown on a wafer 14.

The above-described Cl/H value is varied according to SiC epitaxial film growth conditions such as the temperature and the inside pressure of the reaction chamber 44 of epitaxial film growth.

(4) Effects of the Current Embodiment

According to the current embodiment, at least one of the following effects can be attained.

(a) According to the current embodiment, when a gas mixture of $SiCl_4$ gas, $H_2$ gas, and $C_3H_8$ gas is supplied from the first gas supply nozzle 60a into the reaction chamber 44, the concentration or supply flow rate of the $H_2$ gas is kept small relative to that of the $SiCl_4$ gas. Furthermore, when a gas mixture of $SiCl_4$ gas, $H_2$ gas, and $C_3H_8$ gas is supplied from the first gas supply nozzle 60a into the reaction chamber 44, $H_2$ gas is supplied from the second gas supply nozzle 60b into the reaction chamber 44. By this, the Cl/H value of the inside of the first gas supply nozzle 60a is kept greater than the Cl/H value of the inside of the reaction chamber 44. As a result, thermal decomposition of the $SiCl_4$ gas can be suppressed inside the first gas supply nozzle 60a, and thus Si deposition can be suppressed inside the first gas supply nozzle 60a.

Figure 8:
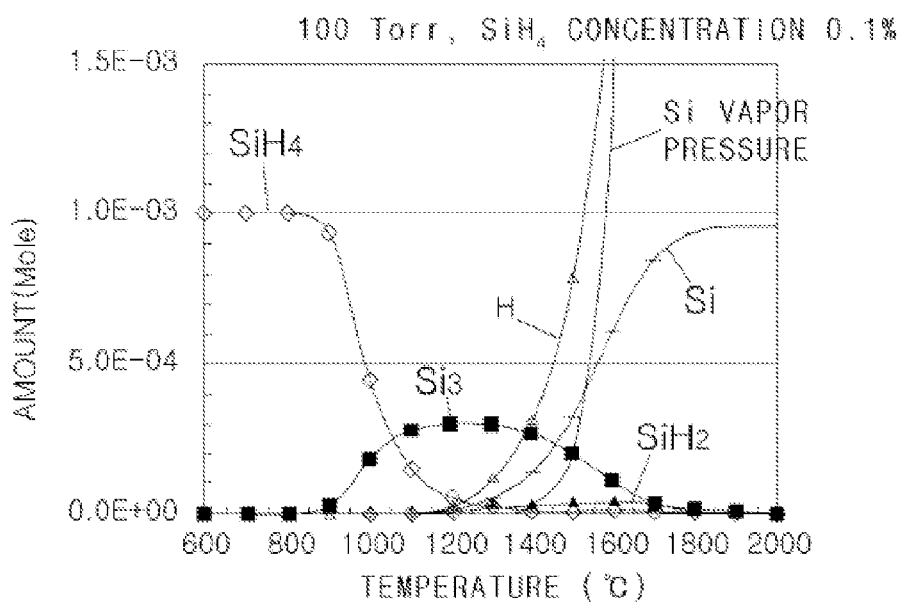
FIG. 8 is an exemplary graph showing calculation results of equilibrium concentrations of a $SiCl_4$ gas-$H_2$ gas reaction system.

(b) According to the current embodiment, as a gas containing silicon and chlorine that is supplied through the first gas supply nozzle 60a, a gas not containing hydrogen atoms in its molecules, such as $SiCl_4$ gas, is used. Therefore, thermal decomposition of the gas containing silicon and chlorine can be suppressed, and Si deposition can be suppressed inside the first gas supply nozzle 60a. On the other hand, if a gas such as $SiH_4$ gas containing hydrogen atoms in its molecules is supplied through the first gas supply nozzle 60a, since the $SiH_4$ gas is thermally decomposed at a relatively low temperature (for example, in the range from 950° C. to 1050° C.), the $SH_4$ gas may be insufficiently supplied into the reaction chamber 44, and the deposition amount of Si may be increased inside the first gas supply nozzle 60a. FIG. 8 is an exemplary graph showing calculation results of equilibrium concentrations of a $SiCl_4$ gas-$H_2$ gas reaction system, and FIG. 9 is an exemplary table showing properties of various Si source gases.

(c) According to the current embodiment, owing to the above-described effects (a) and (b), the first gas supply nozzle 60a can be prevented from being clogged by deposited Si, and gas can be stably supplied into the reaction chamber 44.

(d) According to the current embodiment, owing to the above-described effects (a) and (b), consumption of $SiCl_4$ gas caused by decomposition of the $SiCl_4$ gas in the first gas supply nozzle 60a can be reduced, and thus insufficient supply of $SiCl_4$ to a wafer 14 can be prevented.

(e) According to the current embodiment, owing to the above-described effects (a) and (b), generation of contaminants in the first gas supply nozzle 60a can be suppressed. Therefore, diffusion of contaminants into the reaction chamber 44 can be prevented, and thus the substrate processing quality can be improved.

(f) According to the current embodiment, owing to the above-described effects (a) and (b), even if the inside of the first gas supply nozzle 60a is heated to a temperature higher than the melting point of Si, permeation of melt Si into the reaction chamber 44 can be prevented, and thus the possibility of a crystalline defect on the surface of a wafer 14 can be reduced.

(g) According to the current embodiment, at the insides of the first gas supply pipe 62a and the first gas supply nozzle 60a, $SiCl_4$ gas which is a gas containing silicon and chlorine is preliminarily mixed with $C_3H_8$ gas which is a carbon-containing gas. Therefore, the $SiCl_4$ gas and the $C_3H_8$ gas can be sufficiently mixed with each other before they reach a wafer 14, and thus a SiC film having a uniform SiC composition ratio can be formed. In addition, for example, if there is the possibility of a hydrogen reduction reaction of the gas containing silicon and chlorine due to the hydrogen component of the carbon-containing gas, it is preferable to additionally supply a chlorine-containing gas (for example, HCl gas or $Cl_2$ gas) to the insides of the first gas supply pipe 62a and the first gas supply nozzle 60a. By this, the hydrogen reduction reaction can be suppressed.

(h) According to the current embodiment, the downstream side of the first gas supply nozzle 60a extends upward along the inner wall of the susceptor 48 to a position close to the upper end of the boat 30. Furthermore, the first gas supply holes 68a is formed in the lateral wall of the vertical part of the first gas supply nozzle 60a in a manner such that the first gas supply holes 68a are vertically arranged, so as to supply gas in a direction parallel to main surfaces of wafers 14 held in the boat 30.

Therefore, gas can be efficiently and uniformly supplied to the surfaces of the wafers 14 that are arranged at predetermined intervals, and thus the film thickness uniformity can be improved between the wafers 14 and in the surface of each wafer 14.

(i) According to the current embodiment, when gases are supplied through the first gas supply nozzle 60a and the second gas supply nozzle 60b, Ar gas is supplied to a space between the outer tube 42 and the inner insulating wall 54. Therefore, the gases supplied through the first gas supply nozzle 60a and the second gas supply nozzle 60b can be prevented form entering the space between the outer tube 42 and the inner insulating wall 54, and thus adhesion of unnecessary byproducts on parts such as the inner wall of the outer tube 42 can be prevented.

(j) According to the current embodiment, owing to the above-described effects (a) to (j), in the substrate processing apparatus having a vertical structure in which a plurality of vertically stacked wafers 14 are processed in the reaction chamber 44, formation of SiC epitaxial films is possible, and stable growth of the SiC epitaxial films is possible. That is, the productivity (throughput) of a substrate processing process can be improved.

<Second Embodiment of Invention>

The current embodiment is different from the above-described embodiment, in that a gas mixture (second gas mixture) of $SiCl_4$ gas, Ar gas, and $C_3H_8$ gas is supplied through the first gas supply nozzle 60a, and $H_2$ gas is supplied through the second gas supply nozzle 60b. That is, instead of supplying $H_2$ gas into the first gas supply nozzle 60a as a carrier gas (or reducing gas), Ar gas is supplied as a carrier gas in the current embodiment. A substrate processing apparatus of the current embodiment has the same structure as the structure of the substrate processing apparatus 10 of the first embodiment, and thus a description thereof will not be repeated.

In a gas supply operation S4 of the current embodiment, the valves 73a and 93a are opened, and Argon (Ar) gas which is a carrier gas and tetrachlorosilane ($SiCl_4$) gas which is a gas containing silicon and chlorine are introduced into the reaction chamber 44 through the first gas supply pipe 62a, the first gas supply nozzle 60a, and the first gas supply holes 68a while controlling the flow rates of the gases by using the MFCs 74a and 94a. In addition, the valve 83c is opened, and propane ($C_3H_8$) gas which is a carbon-containing gas is supplied into the reaction chamber 44 through the third gas supply pipe 62c, the first gas supply nozzle 60a, and the first gas supply holes 68a while controlling the flow rate of the propane gas by using the MFC 84c. At this time, the valves 83a and 73c are maintained in a closed state. That is, in the current embodiment, $H_2$ gas is not supplied into the first gas supply nozzle 60a.

Furthermore, at this time, the valve 63b is opened, and $H_2$ gas which is a reducing gas is supplied into the reaction chamber 44 through the second gas supply pipe 62b, the second gas supply nozzle 60b, and the second gas supply holes 68b while controlling the flow rate of the $H_2$ gas by using the MFC 64b. By supplying the $H_2$ gas through the second gas supply pipe 62b, a hydrogen reduction reaction of the $SiCl_4$ gas can occur in the reaction chamber 44, and thus SiC epitaxial films can be efficiently grown on wafers 14.

Furthermore, in the substrate processing process of the current embodiment, the following exemplary process conditions may be used.

Process temperature: 1500° C. to 1700° C.,
Process pressure: 10 Torr to 200 Torr,
$SiCl_4$ gas supply rate (total): 0.1 SLM to 1.0 SLM,
$C_3H_8$ gas supply rate (total): 0.1 SLM to 1.0 SLM,
Ar gas supply rate (total): 10 SLM to 20 SLM, and
$H_2$ gas supply rate (total): 100 SLM to 200 SLM While maintaining the respective process conditions at constant values within the respective ranges, SiC films are epitaxially grown on the wafers 14.

In the substrate processing process of the current embodiment, the following exemplary process conditions may be used.

Process temperature: 1500° C. to 1700° C.,
Process pressure: 1 Torr to 100 Torr,
$SiCl_4$ gas supply rate (total): 0.1 SLM to 1.0 SLM,
$C_3H_8$ gas supply rate (total): 0.1 SLM to 1.0 SLM, and
$H_2$ gas supply rate (total): 100 SLM to 200 SLM While maintaining the respective process conditions at constant values within the respective ranges, SiC films are epitaxially grown on the wafers 14. In addition, it is possible to further increase the rate of the film formation if the process pressure is set to the above-mentioned pressure.

In the current embodiment, the Cl/H value of the inside of the first gas supply nozzle 60a is also kept greater than the Cl/H value of the inside of the reaction chamber 44, so that the same effects as in the first embodiment can be attained.

Figure 10:
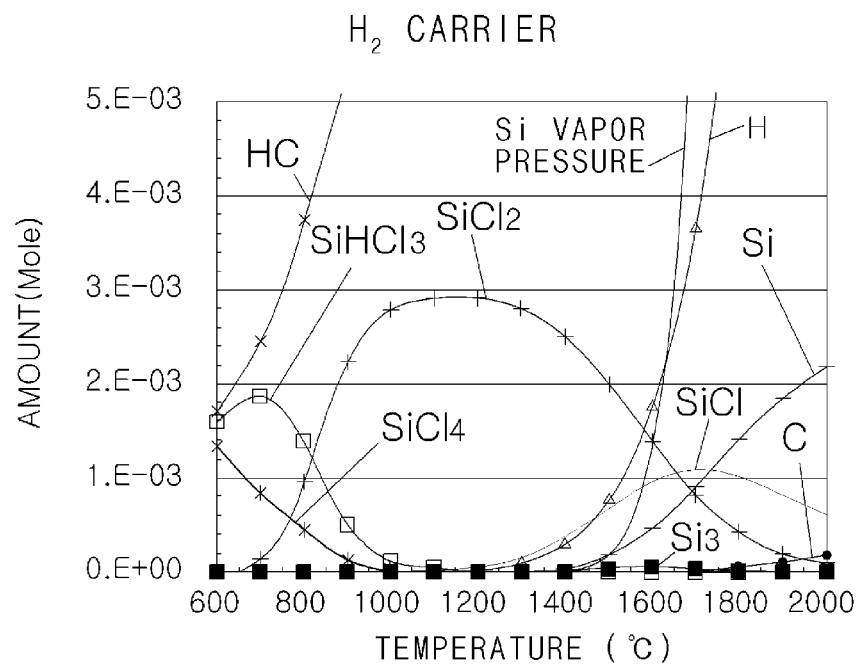
FIG. 10 is an exemplary graph showing calculation results of equilibrium concentrations of reaction species when $H_2$ gas is used as a carrier gas.
Figure 11:
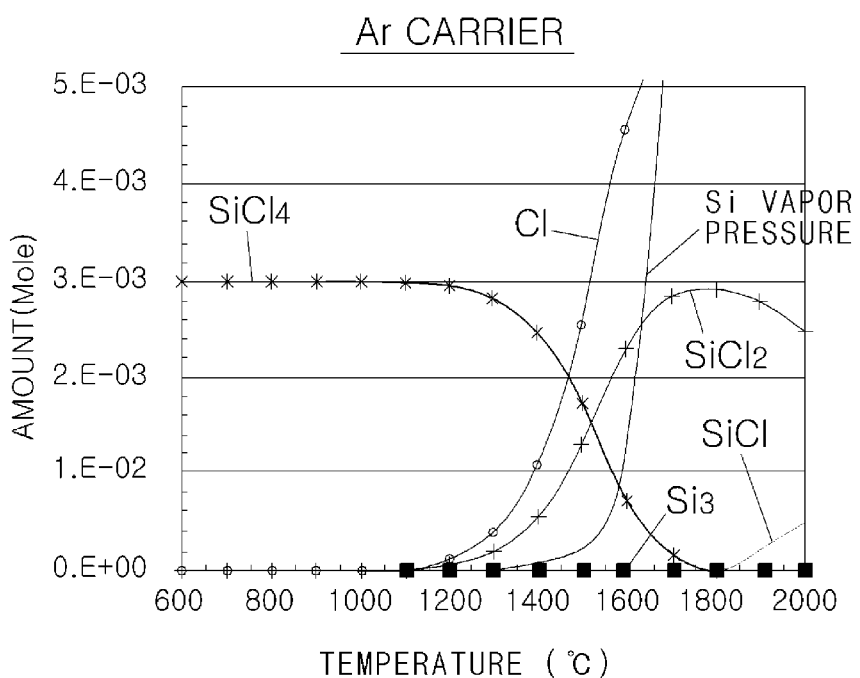
FIG. 11 is an exemplary graph showing calculation results of equilibrium concentrations of reaction species when argon (Ar) gas is used as a carrier gas.

Furthermore, in the current embodiment, since $H_2$ gas is not supplied into the first gas supply nozzle 60a as a carrier gas, $SiCl_4$ gas may be decomposed not by hydrogen reduction reaction but heat decomposition. Therefore, decomposition of the $SiCl_4$ and deposition of Si may be more effectively suppressed inside the first gas supply nozzle 60a. Even if the inside temperature of the first gas supply nozzle 60a is high (for example, in the range from 1500° C. to 1700° C.), decomposition of the $SiCl_4$ gas and deposition of Si may be more effectively suppressed. FIG. 10 is a graph showing calculation results of equilibrium concentrations of reaction species when $H_2$ gas is used as a carrier gas, and FIG. 11 is a graph showing calculation results of equilibrium concentrations of reaction species when Ar gas is used as a carrier gas. As it can be understood by comparing the graphs, when Ar gas is used as a carrier gas, decomposition of $SiCl_4$ gas can be more effectively suppressed even in a high temperature range, for example, from 1500° C. to 1700° C., as compared with the case where $H_2$ gas is used as a carrier gas.

<Third Embodiment of Invention>

Figure 13:
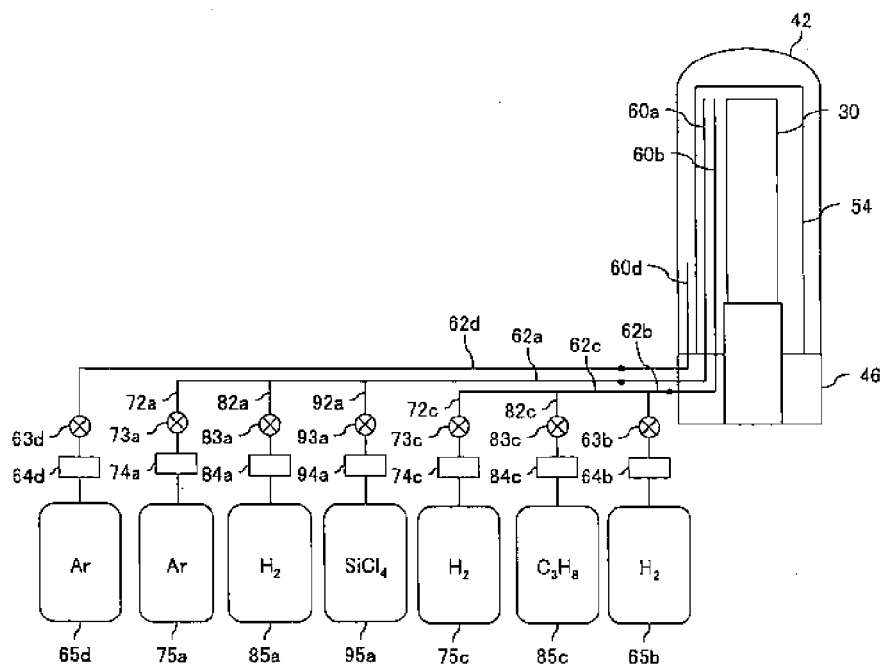
FIG. 13 is an exemplary view illustrating a gas supply system of a substrate processing apparatus 10 according to a third embodiment of the present invention.

A substrate processing apparatus of the current embodiment is different from the substrate processing apparatuses of the previous embodiments, in that a third gas supply system is not connected to the first gas supply unit but the third gas supply system is connected to a second gas supply unit. That is, the current embodiment is different from the previous embodiments, in that the downstream end of a third gas supply pipe 62c is not connected to the upstream end of a first gas supply nozzle 60a but connected to the upstream end of a second gas supply nozzle 60b. FIG. 13 is an exemplary view illustrating a gas supply system of a substrate processing apparatus 10 of the current embodiment. The other structures of the substrate processing apparatus 10 of the current embodiment are the same as those of the substrate processing apparatus 10 of the first embodiment, and thus detailed descriptions thereof will not be repeated.

In addition, the current embodiment is different from the previous embodiments, in that a gas mixture (third gas mixture) of $SiCl_4$ gas and Ar gas is supplied through the first gas supply nozzle 60a, and a gas mixture (fourth gas mixture) of $C_3H_8$ gas and $H_2$ gas is supplied through the second gas supply nozzle 60b. That is, the current embodiment is different from the previous embodiments in that $C_3H_8$ gas including hydrogen atoms in its molecules is supplied through the second gas supply nozzle 60b instead of being supplied through the first gas supply nozzle 60a.

In a gas supply operation S4 of the current embodiment, the valves 73a and 93a are opened, and Argon (Ar) gas which is a carrier gas and tetrachlorosilane ($SiCl_4$) gas which is a gas containing silicon and chlorine are introduced into the reaction chamber 44 through the first gas supply pipe 62a, the first gas supply nozzle 60a, and the first gas supply holes 68a while controlling the flow rates of the gases by using the MFCs 74a and 94a.

In addition, at this time, the valves 63b, 73c, and 83c are opened, and $H_2$ gas which is a reducing gas and propane ($C_3H_8$) gas which is a carbon-containing gas are supplied into the reaction chamber 44 through the second gas supply pipe 62b, the second gas supply nozzle 60b, and the second gas supply holes 68b while controlling the flow rates of the gases by using the MFCs 64b, 74c, and 84c.

Furthermore, in the substrate processing process of the current embodiment, the following exemplary process conditions may be used.

Process temperature: 1500° C. to 1700° C.,
Process pressure: 10 Torr to 200 Torr,
$SiCl_4$ gas supply rate (total): 0.1 SLM to 1.0 SLM,
Ar gas supply rate (total): 10 SLM to 20 SLM,
$C_3H_8$ gas supply rate (total): 0.1 SLM to 1.0 SLM, and
$H_2$ gas supply rate (total): 100 SLM to 200 SLM While maintaining the respective process conditions at constant values within the respective ranges, SiC films are epitaxially grown on wafers 14.

In the substrate processing process of the current embodiment, the following exemplary process conditions may be used.

Process temperature: 1500° C. to 1700° C.,
Process pressure: 1 Torr to 100 Torr,
$SiCl_4$ gas supply rate (total): 0.1 SLM to 1.0 SLM,
$C_3H_8$ gas supply rate (total): 0.1 SLM to 1.0 SLM, and
$H_2$ gas supply rate (total): 100 SLM to 200 SLM While maintaining the respective process conditions at constant values within the respective ranges, SiC films are epitaxially grown on the wafers 14. In addition, it is possible to further increase the rate of the film formation if the process pressure is set to the above-mentioned pressure.

In the current embodiment, the Cl/H value of the inside of the first gas supply nozzle 60a is also kept greater than the Cl/H value of the inside of the reaction chamber 44, and thus the same effects as those of the first and second embodiments can be attained.

Furthermore, in the current embodiment, $H_2$ gas functioning as a carrier gas is not supplied through the first gas supply nozzle 60a, and $C_3H_8$ gas including hydrogen atoms in its molecules is also not supplied through the first gas supply nozzle 60a. Therefore, a hydrogen reduction reaction of the $SiCl_4$ gas caused by the hydrogen of the $C_3H_8$ gas can be prevented, and thus decomposition of the $SiCl_4$ gas and deposition of Si can be effectively suppressed in the first gas supply nozzle 60a.

<Fourth Embodiment of Invention>

In the current embodiment, when a gas mixture (first gas mixture) of $SiCl_4$ gas, $H_2$ gas, and $C_3H_8$ gas is supplied from the first gas supply nozzle 60a into the reaction chamber 44 in the gas supply operation S4 of the first embodiment, the valve 73a is also opened to additionally supply Ar gas from the first gas supply nozzle 60a into the reaction chamber 44.

In the current embodiment, the same effects as those of the first embodiment can be attained.

Furthermore, since Ar gas is additionally supplied as described above in the current embodiment, the total flow rate of gases supplied from the first gas supply nozzle 60a into the reaction chamber 44 can be changed without having to vary the Cl/H value of the inside of the first gas supply nozzle 60a, so that process conditions such as the velocity of gases in the reaction chamber 44 can be freely adjusted. The flow rate of Ar gas may be set, for example, in the range from 10 SLM to 20 SLM.

<Another Embodiment of Invention>

Gases supplied through the first and second gas supply nozzles 60a and 60b are not limited to the above-mentioned gases. That is, other proper gases may be used according to purposes.

In the above-described embodiments, it is preferable to further supply hydrogen chloride (HCl) from the second gas supply holes 68b as the second supply outlets. In this case, the downstream side of the gas supply pipe for HCl gas is connected to the downstream side of the valve 63b of the second gas supply pipe 62b. At the gas supply pipe for HCl gas, a HCl gas supply source, MFC, and valve are sequentially installed from the upstream side of the gas supply pipe for HCl gas. By supplying HCl gas from the second gas supply holes 68b, it is possible to flexibly adjust the amount of Cl in the reaction chamber 44.

For example, instead of using tetrachlorosilane ($SiCl_4$) gas as a gas containing silicon and chlorine, trichlorosilane ($SiHCl_3$) gas or dichlorosilane ($SiH_2Cl_2$) gas may be used. In addition, instead of using a gas containing silicon and chlorine, a gas mixture of a silicon-containing gas and a chlorine-containing gas may be used. As a silicon-containing gas, a gas such as disilane ($Si_2H_6$) gas or trisilane ($Si_3H_8$) gas may be supplied. In addition, as a chlorine-containing gas, a gas such as hydrogen chloride (HCl) gas or chlorine ($Cl_2$) gas may be supplied. However, it may be preferable that a gas such as $SiCl_4$ gas that does not include hydrogen atoms in its molecules be supplied as a gas containing silicon and chlorine or a gas containing silicon.

Furthermore, instead of using $H_2$ gas as a reducing gas, another hydrogen-containing gas such as ammonia ($NH_3$) gas may be used.

Furthermore, although $C_3H_8$ gas is used as a carbon-containing gas in the above-described embodiments, another gas such as ethylene ($C_2H_4$) gas or propylene ($C_3H_6$) gas may be used as a carbon-containing gas.

In addition, although argon (Ar) gas which is a rare gas is used as a carrier or purge gas, another gas such as helium (He) gas, neon (Ne) gas, krypton (Kr) gas, or xenon (Xe) gas may be used as a carrier or purge gas. Preferably, a rare gas having a low atomic weight such as helium (He) gas, neon (Ne) gas, or argon (Ar) may be used, and more preferably, inexpensive argon (Ar) gas may be used.

In addition, the present invention is not limited to the case where each of the first and second gas supply nozzles 60a and 60b is one in number. For example, a plurality of first gas supply nozzles 60a and a plurality of second gas supply nozzles 60b may be provided. In addition, the second gas supply nozzle 60b is not limited to the above-described structure. For example, like the fourth gas supply nozzle 60d, the second gas supply nozzle 60b may extend only up to a position close to the lower end of the boat 30. In addition, the dispositions of the first and second gas supply nozzles 60a and 60b may be changed each other.

In addition, a dopant gas supply nozzle (not shown) may be installed in the reaction chamber 44 to supply a dopant gas for forming an n-type doped layer. The dopant gas supply nozzle may have the same structure as that of the first gas supply nozzle 60a or the second gas supply nozzle 60b. For example, nitrogen ($N_2$) gas may be used as a dopant gas for forming an n-type doped layer, and a boron-containing gas or an aluminum-containing gas may be used as a dopant gas for forming a p-type doped layer.

Furthermore, in the above-described embodiments, the first gas supply holes 68a are provided for wafers 14 held in the boat 30, respectively, and the second gas supply holes 68b are provided for the wafers 14 held in the boat 30, respectively. However, the present invention is not limited thereto. For example, at least one first gas supply hole 68a or at least one second gas supply hole 68b may be provided at least at a lateral side of the wafers 14 held in the boat 30, for example, in a region between the magnetic coil 50 and the wafers 14. In addition, at least one first gas supply hole 68a or at least one second gas supply hole 68b may be provided at least at a lateral side of the wafers 14 held in the boat 30 for every several wafers 14.

Furthermore, although the above-described embodiments relate to the cases of growing SiC epitaxial films, the present invention is not limited to the embodiments. That is, the present invention may suitably be applied to other cases where epitaxial films, CVD films, ALD films, or other films are grown by using a silicon-containing gas as a source gas.

According to the substrate processing apparatus, the semiconductor device manufacturing method, and the substrate manufacturing method of the present invention, when silicon carbide (SiC) epitaxial films are grown in a vertical type substrate processing apparatus in which a plurality of substrates are vertically stacked in a reaction chamber and a gas supply nozzle disposed at the inside of the reaction chamber in a region where the substrates are arranged is heated to a temperature higher than the decomposition temperature of the Si source gas, decomposition of a silicon (Si) source gas in the gas supply nozzle and deposition of Si on a part such as the inner wall of the gas supply nozzle can be suppressed.

While the present invention has been particularly described with reference to the embodiments, the present invention is not limited to the embodiments, but various changes and modifications may be made in the present invention without departing from the scope of the invention.

<Supplementary Note>

The present invention also includes the following embodiments.

[Supplementary Note 1]

According to an embodiment of the present invention, there is provided a substrate processing apparatus comprising:

a reaction chamber configured to process a plurality of substrates stacked at predetermined intervals;

a first gas supply system configured to supply at least a silicon-containing gas and a chlorine-containing gas or supply at least a gas containing silicon and chlorine;

a first gas supply unit connected to the first gas supply system and comprising a first gas supply outlet for supplying a gas in a direction parallel to main surfaces of the substrates disposed in the reaction chamber;

a second gas supply system configured to supply at least a reducing gas;

a second gas supply unit connected to the second gas supply system and comprising at least a second gas supply outlet;

a third gas supply system configured to supply at least a carbon-containing gas and connected to at least one of the first gas supply unit and the second gas supply unit; and a control unit configured to control the first gas supply system so that at least the silicon-containing gas and the chlorine-containing gas or at least the gas containing silicon and chlorine is supplied into the reaction chamber from the first gas supply outlet of the first gas supply unit, the second gas supply system so that at least the reducing gas is supplied into the reaction chamber from the second gas supply outlet of the second gas supply unit, and the third gas supply system so that at least the carbon-containing gas is supplied into the reaction chamber from the first gas supply outlet of the first gas supply unit or the second gas supply outlet of the second gas supply unit, so as to form silicon carbide films on the substrates.

[Supplementary Note 2]

According to another embodiment of the present invention, there is provided a semiconductor device manufacturing method comprising:

loading a plurality of substrates stacked at predetermined intervals into a reaction chamber;

forming silicon carbide films on the substrates by supplying at least a silicon-containing gas and a chlorine-containing gas or at least a gas containing silicon and chlorine into the reaction chamber from a first gas supply outlet of a first gas supply unit which is configured to supply a gas in a direction parallel to main surfaces of the substrates disposed in the reaction chamber, supplying at least a reducing gas into the reaction chamber from a second gas supply outlet of a second gas supply unit, and supplying at least a carbon-containing gas into the reaction chamber from the first gas supply outlet of the first gas supply unit or the second gas supply outlet of the second gas supply unit; and unloading the substrates from the reaction chamber.

[Supplementary Note 3]

According to another embodiment of the present invention, there is provided a substrate manufacturing method comprising:

loading a plurality of substrates stacked at predetermined intervals into a reaction chamber;

forming silicon carbide films on the substrates by supplying at least a silicon-containing gas and a chlorine-containing gas or at least a gas containing silicon and chlorine into the reaction chamber from a first gas supply outlet of a first gas supply unit which is configured to supply a gas in a direction parallel to main surfaces of the substrates disposed in the reaction chamber, supplying at least a reducing gas into the reaction chamber from a second gas supply outlet of a second gas supply unit, and supplying at least a carbon-containing gas into the reaction chamber from the first gas supply outlet of the first gas supply unit or the second gas supply outlet of the second gas supply unit; and unloading the substrates from the reaction chamber.

[Supplementary Note 4]

In the substrate processing apparatus of Supplementary Note 1, the first gas supply system may be configured to further supply a rare gas, and the control unit may be configured to control the first gas supply system, so that at least the silicon-containing gas, the chlorine-containing gas, and the rare gas are supplied into the reaction chamber from the first gas supply outlet of the first gas supply unit, or at least the gas containing silicon and chlorine and the rare gas are supplied into the reaction chamber from the first gas supply outlet of the first gas supply unit.

[Supplementary Note 5]

In the substrate processing apparatus of Supplementary Note 1, the first gas supply system may be configured to further supply argon gas, and the control unit may be configured to control the first gas supply system, so that at least the silicon-containing gas, the chlorine-containing gas, and the argon gas are supplied into the reaction chamber from the first gas supply outlet of the first gas supply unit, or at least the gas containing silicon and chlorine and the argon gas are supplied into the reaction chamber from the first gas supply outlet of the first gas supply unit.

[Supplementary Note 6]

In the substrate processing apparatus of Supplementary Note 1, the second gas supply unit may be configured so that a gas is supplied through the second gas supply outlet in a direction parallel to the main surfaces of the substrates disposed in the reaction chamber.

[Supplementary Note 7]

In the substrate processing apparatus of Supplementary Note 1, the second gas supply system may be configured to supply hydrogen gas as the reducing gas, and the control unit may be configured to control the second gas supply system so that at least the hydrogen gas is supplied into the reaction chamber from the second gas supply outlet of the second gas supply unit.

[Supplementary Note 8]

In the substrate processing apparatus of Supplementary Note 6, the first gas supply unit may comprise a first gas supply nozzle installed in the reaction chamber and comprising an inner gas flow passage, and the second gas supply unit may comprise a second gas supply nozzle installed in the reaction chamber and comprising an inner gas flow passage.

[Supplementary Note 9]

In the substrate processing apparatus of Supplementary Note 1, the silicon-containing gas may be silane gas, disilane gas, or trisilane gas, the chlorine-containing gas may be hydrogen chloride gas or chlorine gas, the carbon-containing gas may be propane gas, ethylene gas, or propylene gas, and the gas containing silicon and chlorine may be tetrachlorosilane gas, trichlorosilane gas, or dichlorosilane gas.

[Supplementary Note 10]

In the substrate processing apparatus of Supplementary Note 1, the inside of the reaction chamber may be maintained at a temperature of 1500° C. to 1700° C. and a pressure of 10 Torr to 200 Torr during forming the silicon carbide films on the substrates.

[Supplementary Note 11]

According to another embodiment of the present invention, there is provided a substrate manufacturing method comprising:

loading a plurality of substrates stacked at predetermined intervals into a reaction chamber; and forming silicon carbide films on the substrates by supplying at least a silicon-containing gas, a carbon-containing gas, and a chlorine-containing gas through a first gas supply outlet provided in a substrate-arrangement region of a gas supply nozzle installed in the reaction chamber, and supplying at least a reducing gas through a second gas supply outlet provided in the reaction chamber at a position different from a position where the gas supply nozzle is installed.

[Supplementary Note 12]

According to another embodiment of the present invention, there is provided a substrate manufacturing method comprising:

loading a plurality of substrates stacked at predetermined intervals into a reaction chamber; and forming silicon carbide films on the substrates by supplying at least a silicon-containing gas, a carbon-containing gas, a chlorine-containing gas, and a rare gas through a first gas supply outlet provided in a substrate-arrangement region of a gas supply nozzle installed in the reaction chamber, and supplying at least a reducing gas through a second gas supply outlet provided in the reaction chamber at a position different from a position where the gas supply nozzle is installed.

[Supplementary Note 13]

In the substrate manufacturing methods of Supplementary Notes 11 and 12, a reducing gas may be further supplied through the first gas supply outlet.

[Supplementary Note 14]

In the substrate manufacturing methods of Supplementary Notes 11 and 12, the reducing gas may be hydrogen gas or a hydrogen-containing gas, and preferably, the reducing gas may be hydrogen gas.

[Supplementary Note 15]

In the substrate manufacturing method of Supplementary Note 12, the rare gas may be helium gas, neon gas, argon gas, or krypton gas, and preferably, the rare gas may be argon gas.

[Supplementary Note 16]

In the substrate manufacturing methods of Supplementary Notes 11 and 12, in the forming of the silicon carbide films on the substrates, the substrates may be induction-heated.

[Supplementary Note 17]

In the substrate manufacturing methods of Supplementary Notes 11 and 12, the gas supply nozzle may extend to a region where the substrates are arranged, and the first gas supply outlet may be provided in the substrate-arrangement region.

[Supplementary Note 18]

In the substrate manufacturing method of any one of Supplementary Notes 11 to 13, the amount of the reducing gas supplied through the first gas supply outlet may be smaller than the amount of the reducing gas supplied through the second gas supply outlet.

[Supplementary Note 19]

In the substrate manufacturing method of any one of Supplementary Notes 11 to 18, in the forming of the silicon carbide on the substrates, the substrates are heated in the range from 1500° C. to 1700° C.

[Supplementary Note 20]

In the substrate manufacturing method of any one of Supplementary Notes 11 to 18, in the forming of the silicon carbide on the substrates, the inside pressure of the reaction chamber is maintained in the range from 10 Torr to 200 Torr.

[Supplementary Note 21]

According to another embodiment of the present invention, there is provided a substrate processing apparatus comprising: a reaction chamber configured to process a substrate; a first gas supply system configured to supply at least a silicon-containing gas, a carbon-containing gas, and a chlorine-containing gas into the reaction chamber; a second gas supply system configured to supply at least a reducing gas into the reaction chamber; a first gas supply outlet provided in a substrate-arrangement region of a gas supply nozzle installed in the processing chamber; a second gas supply outlet provided in the reaction chamber at a position different a position where the gas supply nozzle is installed; and a controller configured to control the first gas supply system so that at least the silicon-containing gas, the carbon-containing gas, and the chlorine-containing gas are supplied into the reaction chamber through the first gas supply outlet, and the second gas supply system so that at least the reducing gas is supplied into the reaction chamber through the second gas supply outlet, so as to form a silicon carbide film on the substrate.

[Supplementary Note 22]

According to another embodiment of the present invention, there is provided a substrate processing apparatus comprising: a reaction chamber configured to process a substrate; a first gas supply system configured to supply at least a silicon-containing gas, a carbon-containing gas, a chlorine-containing gas, and a rare gas into the reaction chamber; a second gas supply system configured to supply at least a reducing gas into the reaction chamber; a first gas supply outlet provided in a substrate-arrangement region of a gas supply nozzle installed in the processing chamber; a second gas supply outlet provided in the reaction chamber at a position different a position where the gas supply nozzle is installed; and a controller configured to control the first gas supply system so that at least the silicon-containing gas, the carbon-containing gas, the chlorine-containing gas, and the rare gas are supplied into the reaction chamber through the first gas supply outlet, and the second gas supply system so that at least the reducing gas is supplied into the reaction chamber through the second gas supply outlet, so as to form a silicon carbide film on the substrate.

What is claimed is:

1. A semiconductor device manufacturing method comprising:
    (a) loading a plurality of substrates stacked at predetermined intervals into a reaction chamber;
    (b) forming silicon carbide films on the plurality of substrates by:
        supplying, as a source gas, at least a silicon-containing gas free of hydrogen atoms and a chlorine-containing gas free of hydrogen atoms or at least a gas containing silicon and chlorine and free of hydrogen atoms into the reaction chamber from a first gas supply outlet of a first gas supply unit configured to supply a gas in a direction parallel to main surfaces of the plurality of substrates disposed in the reaction chamber,
        supplying, as a reducing gas, at least a hydrogen gas or a hydrogen-containing gas into the reaction chamber from a second gas supply outlet of a second gas supply unit, and
        supplying at least a carbon-containing gas into the reaction chamber from the first gas supply outlet of the first gas supply unit or the second gas supply outlet of the second gas supply unit while controlling the first gas supply unit and the second gas supply unit in a manner that a ratio of chlorine to hydrogen supplied into the reaction chamber is smaller than a predetermined value; and
    (c) etching an inside of the first gas supply unit by controlling the first gas supply unit in a manner that the ratio of chlorine to hydrogen inside the first gas supply unit is greater than the predetermined value.

2. A substrate manufacturing method comprising:
    (a) loading a plurality of substrates stacked at predetermined intervals into a reaction chamber; and
    (b) forming silicon carbide films on the substrates by:
        supplying, as a source gas, at least a silicon-containing gas free of hydrogen atoms and a chlorine-containing gas free of hydrogen atoms or at least a gas containing silicon and chlorine and free of hydrogen atoms into the reaction chamber from a first gas supply outlet of a first gas supply unit configured to supply a gas in a direction parallel to main surfaces of the substrates disposed in the reaction chamber;
        supplying, as a reducing gas, at least hydrogen gas or a hydrogen-containing gas into the reaction chamber from a second gas supply outlet of a second gas supply unit; and supplying at least a carbon-containing gas into the reaction chamber from the first gas supply outlet of the first gas supply unit or the second gas supply outlet of the second gas supply unit while controlling the first gas supply unit and the second gas supply unit in a manner that a ratio of chlorine to hydrogen supplied into the reaction chamber is smaller than a predetermined value; and
    (c) etching an inside of the first gas supply unit by controlling the first gas supply unit in a manner that the ratio of chlorine to hydrogen inside the first gas supply unit is greater than the predetermined value.

3. The semiconductor device manufacturing method of claim 1, wherein the first gas supply unit and the second gas supply unit are controlled in a manner that the ratio of chlorine to hydrogen in the reaction chamber is smaller than a ratio of chlorine to hydrogen in the first gas supply unit in (b).

4. The semiconductor device manufacturing method of claim 1, wherein the first gas supply unit and the second gas supply unit are controlled in a manner that a ratio of chlorine to hydrogen in the first gas supply unit is greater than the ratio of chlorine to hydrogen in the reaction chamber in (c).

5. The semiconductor device manufacturing method of claim 1, wherein the source gas comprises $SiCl_4$ gas, and the reducing gas comprises $H_2$ gas.

6. The semiconductor device manufacturing method of claim 5, wherein the first gas supply unit comprises a gas supply nozzle extending into the reaction chamber.

7. The substrate manufacturing method of claim 2, wherein the first gas supply unit and the second gas supply unit are controlled in a manner that the ratio of chlorine to hydrogen in the reaction chamber is smaller than a ratio of chlorine to hydrogen in the first gas supply unit in (b).

8. The substrate manufacturing method of claim 2, wherein the first gas supply unit and the second gas supply unit are controlled in a manner that a ratio of chlorine to hydrogen in the first gas supply unit is greater than the ratio of chlorine to hydrogen in the reaction chamber in (c).

9. The substrate manufacturing method of claim 2, wherein the source gas comprises $SiCl_4$ gas, and the reducing gas comprises $H_2$ gas.

10. The substrate manufacturing method of claim 9, wherein the first gas supply unit comprises a gas supply nozzle extending into the reaction chamber.

* * * * *